(12) United States Patent
Kunioka et al.

(10) Patent No.: US 7,556,507 B2
(45) Date of Patent: Jul. 7, 2009

(54) CARTRIDGE FOR CONTACT TERMINALS AND SEMICONDUCTOR DEVICE SOCKET PROVIDED WITH THE SAME

(75) Inventors: Shuuji Kunioka, Yokohama (JP); Katsumi Suzuki, Tokyo (JP); Eiichi Murakoshi, Chiba (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 12/004,023

(22) Filed: Dec. 20, 2007

(65) Prior Publication Data

US 2008/0160797 A1 Jul. 3, 2008

Related U.S. Application Data

(62) Division of application No. 11/370,996, filed on Mar. 9, 2006, now Pat. No. 7,335,030.

(30) Foreign Application Priority Data

Mar. 10, 2005 (JP) ............................. 2005-067660
Feb. 20, 2006 (JP) ............................. 2006-043171

(51) Int. Cl.
  *H01R 12/00* (2006.01)
(52) U.S. Cl. ............................. 439/73; 439/66; 324/765
(58) Field of Classification Search ................... 439/66, 439/70–73; 324/765
  See application file for complete search history.

(56) References Cited

U.S. PATENT DOCUMENTS

| 4,420,205 A | 12/1983 | Kirkman |
| 4,739,257 A | 4/1988 | Jenson et al. |
| 4,927,369 A * | 5/1990 | Grabbe et al. ................. 439/66 |
| 5,073,117 A | 12/1991 | Malhi et al. |
| 5,147,213 A | 9/1992 | Funk et al. |
| 5,249,972 A | 10/1993 | Walker |
| 5,281,160 A | 1/1994 | Walkup et al. |
| 5,290,193 A | 3/1994 | Goff et al. |
| 5,342,213 A | 8/1994 | Kobayashi |
| 5,342,214 A | 8/1994 | Hsu |
| 5,458,499 A | 10/1995 | Matsuoka |
| 5,482,471 A | 1/1996 | Mori et al. |
| 5,518,410 A | 5/1996 | Masami |
| 5,519,882 A | 5/1996 | Asano et al. |

(Continued)

FOREIGN PATENT DOCUMENTS

EP 0 969 710 A2 1/2000

(Continued)

OTHER PUBLICATIONS

Office Action dated Oct. 23, 2007 in corresponding Japanese Patent Application No. 2004-253342.
Official Action from German Patent Office for corresponding German Patent Application No. 10223502.3-55.
Official Letter from Korean Patent Office, dated Sep. 18, 2004, for corresponding Korean Patent Application No. 10-2002-0038155.
Office Action dated Jun. 2, 2008 in U.S. Appl. No. 12/004,049.
Office Action dated Dec. 26, 2008 in corresponding Japanese Patent Application No. 2006-043171.

*Primary Examiner*—Truc T Nguyen
(74) *Attorney, Agent, or Firm*—Finnegan, Henderson, Farabow, Garrett & Dunner, LLP

(57) ABSTRACT

A probe pin cartridge includes a first substrate disposed opposite to a positioning member, a second substrate laid beneath the first substrate, having the same contour as that of the first substrate and a plurality of probe pins held by the first and second substrates.

6 Claims, 43 Drawing Sheets

U.S. PATENT DOCUMENTS

| | | |
|---|---|---|
| 5,531,608 A | 7/1996 | Abe |
| 5,573,427 A | 11/1996 | Sagano |
| 5,585,101 A | 12/1996 | Portman |
| 5,611,705 A | 3/1997 | Pfaff |
| 5,727,954 A | 3/1998 | Kato et al. |
| 5,807,104 A | 9/1998 | Ikeya et al. |
| 5,885,101 A | 3/1999 | Matsuoka et al. |
| 5,923,179 A | 7/1999 | Taylor |
| 5,989,039 A * | 11/1999 | Sik .............................. 439/73 |
| 6,027,355 A | 2/2000 | Ikeya |
| 6,126,467 A | 10/2000 | Ohashi |
| 6,149,449 A | 11/2000 | Abe |
| 6,155,859 A | 12/2000 | Choy |
| 6,162,066 A | 12/2000 | Glick et al. |
| 6,213,806 B1 | 4/2001 | Choy |
| 6,220,869 B1 * | 4/2001 | Grant et al. .................... 439/66 |
| 6,243,267 B1 | 6/2001 | Chuang |
| 6,261,114 B1 | 7/2001 | Shimada |
| 6,280,219 B1 | 8/2001 | Sano et al. |
| 6,280,222 B1 | 8/2001 | Walkup |
| 6,283,780 B1 | 9/2001 | Yamamoto et al. |
| 6,296,505 B1 | 10/2001 | Fukunaga et al. |
| 6,322,384 B1 | 11/2001 | Ikeya |
| 6,328,587 B1 | 12/2001 | Hsu |
| 6,350,138 B1 | 2/2002 | Atobe et al. |
| 6,371,782 B1 | 4/2002 | Ohashi |
| 6,383,002 B1 | 5/2002 | Ohashi |
| 6,402,537 B2 | 6/2002 | Ikeya |
| 6,443,741 B1 | 9/2002 | Watanabe |
| 6,461,182 B1 | 10/2002 | Hsu |
| 6,464,511 B1 | 10/2002 | Watanabe et al. |
| 6,517,370 B2 | 2/2003 | Fukunaga |
| 6,561,831 B1 | 5/2003 | McHugh et al. |
| 6,567,866 B1 | 5/2003 | Poisner |
| 6,609,923 B2 | 8/2003 | Sato et al. |
| 6,676,431 B2 | 1/2004 | Kukita et al. |
| 6,707,309 B2 | 3/2004 | Sato et al. |
| 6,709,279 B2 | 3/2004 | Uratsuji |
| 6,733,320 B2 | 5/2004 | Kukita et al. |
| 6,739,894 B2 | 5/2004 | Ogura |
| 6,752,645 B2 | 6/2004 | Nakamura et al. |
| 6,758,684 B2 | 7/2004 | Oikawa et al. |
| 6,776,641 B2 | 8/2004 | Hachuda |
| 6,776,643 B2 | 8/2004 | Nakano |
| 6,793,512 B2 | 9/2004 | Abe et al. |
| 6,796,823 B1 | 9/2004 | Nakano et al. |
| 6,960,092 B1 | 11/2005 | Hussain et al. |
| 6,976,852 B2 | 12/2005 | Azumi et al. |
| 6,976,863 B2 | 12/2005 | Sato |
| 7,118,386 B2 | 10/2006 | Sato et al. |
| 7,165,978 B2 | 1/2007 | Sato et al. |
| 7,204,708 B2 | 4/2007 | Sato et al. |
| 7,282,859 B2 | 10/2007 | Kim et al. |
| 2004/0248435 A1 | 12/2004 | Sato et al. |
| 2004/0253862 A1 | 12/2004 | Masaki et al. |
| 2006/0034990 A1 | 3/2006 | Sato et al. |
| 2006/0228915 A1 | 10/2006 | Sato et al. |
| 2007/0007984 A1 | 1/2007 | Kojima et al. |

FOREIGN PATENT DOCUMENTS

| | | |
|---|---|---|
| EP | 0 969 711 A2 | 1/2000 |
| EP | 1 111 724 A2 | 6/2001 |
| JP | 57-125632 | 1/1984 |
| JP | 60-189977 | 12/1985 |
| JP | 62-160676 | 7/1987 |
| JP | 63-299257 | 12/1988 |
| JP | 01-81887 | 5/1989 |
| JP | 02-049381 | 2/1990 |
| JP | 02-119378 | 9/1990 |
| JP | 04-072927 | 3/1992 |
| JP | 04-109543 B2 | 4/1992 |
| JP | 04-308676 | 10/1992 |
| JP | 04-135190 | 12/1992 |
| JP | 05-11374 | 2/1993 |
| JP | 05-029050 | 2/1993 |
| JP | 05-047445 | 2/1993 |
| JP | 05-020286 | 3/1993 |
| JP | 06-020752 | 1/1994 |
| JP | 06-020753 | 1/1994 |
| JP | 06-203936 | 7/1994 |
| JP | 06-290839 | 10/1994 |
| JP | 07-239362 | 9/1995 |
| JP | 08-046335 | 2/1996 |
| JP | 08-138812 | 5/1996 |
| JP | 08-213088 | 8/1996 |
| JP | 08-222335 | 8/1996 |
| JP | 09-55273 | 2/1997 |
| JP | 09-092421 | 4/1997 |
| JP | 2665419 B2 | 6/1997 |
| JP | 09-199217 | 7/1997 |
| JP | 09-199250 A | 7/1997 |
| JP | 09-211067 | 8/1997 |
| JP | 09-245920 | 9/1997 |
| JP | 10-073635 | 3/1998 |
| JP | 10-256764 | 9/1998 |
| JP | 10-302925 | 11/1998 |
| JP | 11-02126 | 1/1999 |
| JP | 11-097818 | 4/1999 |
| JP | 11-126671 | 5/1999 |
| JP | 11-238566 | 8/1999 |
| JP | 02-973406 | 9/1999 |
| JP | 11-329643 | 11/1999 |
| JP | 2000-113954 | 4/2000 |
| JP | 2000-133390 | 5/2000 |
| JP | 2000-150092 | 5/2000 |
| JP | 2000-182739 | 6/2000 |
| JP | 2000-182740 | 6/2000 |
| JP | 03-072548 | 8/2000 |
| JP | 2000-340324 A | 12/2000 |
| JP | 2001-043462 | 2/2001 |
| JP | 2001-043947 | 2/2001 |
| JP | 2001-066346 | 3/2001 |
| JP | 2001-91577 | 4/2001 |
| JP | 2001-115037 | 4/2001 |
| JP | 2001-151234 | 5/2001 |
| JP | 2001-185313 | 7/2001 |
| JP | 2001-326045 | 11/2001 |
| JP | 2001-522523 | 11/2001 |
| JP | 03-257994 | 12/2001 |
| JP | 2002-063975 | 2/2002 |
| JP | 2002-202344 | 7/2002 |
| JP | 2002-202729 | 7/2002 |
| JP | 2002-231398 | 8/2002 |
| JP | 2002-313510 | 10/2002 |
| JP | 2002-314005 | 10/2002 |
| JP | 2003-007942 | 1/2003 |
| JP | 2003-17207 | 1/2003 |
| JP | 2003-35745 | 2/2003 |
| JP | 2003-123923 | 4/2003 |
| JP | 2003-123924 | 4/2003 |
| JP | 2003-123925 | 4/2003 |
| JP | 2003-123926 | 4/2003 |
| JP | 2003-217771 | 7/2003 |
| JP | 2003-308940 | 10/2003 |
| JP | 2004-014873 | 1/2004 |
| JP | 2004-79227 | 3/2004 |
| JP | 2004-111215 | 4/2004 |
| JP | 2004-214177 | 7/2004 |
| JP | 2004-227907 | 8/2004 |
| JP | 2004-355983 | 12/2004 |
| JP | 2005-26213 | 1/2005 |
| JP | 2005-37156 | 2/2005 |
| JP | 2005-276843 | 10/2005 |

| JP | 2006-294281 | 10/2006 | WO | WO 03/030604 | 4/2003 |
| JP | 2007-17234 | 1/2007 | WO | WO 03/031994 | 4/2003 |
| JP | 2007-500426 | 1/2007 | | | |

* cited by examiner

CARTRIDGE FOR CONTACT TERMINALS AND SEMICONDUCTOR DEVICE SOCKET PROVIDED WITH THE SAME

This application claims priority from Japanese Patent Application Nos. 2005-067660 filed Mar. 10, 2005 and 2006-043171 filed Feb. 20, 2006 which are incorporated hereinto by reference.

BACKGROUND OF THE INVENTION

1. Field of the Invention

The present invention relates to a cartridge for contact terminals and a semiconductor device socket detachably provided with such a cartridge.

2. Description of the Related Art

Semiconductor devices to be mounted to electronic equipments or others are subjected to various tests prior to being mounted so that latent defects thereof are removed. Such tests are carried out via a semiconductor device socket on which the semiconductor device to be tested is detachably mounted.

The semiconductor device sockets subjected to such tests are generally referred to as IC sockets disclosed, for example, in Japanese Patent Application Laid-open Nos. 2004-71240, 2002-202344 and 2003-045594, which are arranged on a printed wiring board having an input/output section supplied with a predetermined test voltage and outputting signals representing abnormalities, such as a short-circuit, of the semiconductor devices to be tested.

Such an IC socket incorporates a contact terminal group in the interior of a socket body, for electrically connecting the input/output section in the printed wiring board with the terminal group of the semiconductor device. If a stable electric connection becomes difficult due to any fault or the end of life span of the contact terminal, such a contact terminal group is exchanged to a fresh one. To facilitate the operation for exchanging such contact terminals, a socket block having an accommodating portion for the semiconductor device and a plurality of contact pins are proposed, as shown, for example, in Japanese Patent Application Laid-open No. 2002-243794. The socket block is disposed in the interior of the socket body of a predetermined type to be easily detachable.

In this socket block, when the used contact pins are exchanged to fresh ones, the socket block is initially removed from the interior of the socket body as a whole, and then the respective contact pins are simply detached from the socket blocks and easily replaced to fresh ones.

SUMMARY OF THE INVENTION

In an IC socket of a surface mounting type, it is desired in view of the test efficiency, that IC sockets are arranged as many as possible on one printed wiring board. In the structure wherein the socket block is disposed in the interior of the socket body as described above, however, the socket body becomes larger in size in accordance with a thickness of an outer wall of the socket block, whereby an occupation area of the respective socket body increases, whereby a number of IC sockets may not be arranged.

Also, when the socket block of the above-mentioned type is desired to be disposed on an IC socket of other types such as a clam shell type or an amount of pressure-adjustment type, the design of the socket block must be largely changed in accordance with the respective types.

With reference to the above problems, an object of the present invention is to provide a cartridge for contact terminals and a semiconductor device socket detachably provided with the contact terminal cartridge, a body size of which socket does not become larger to be simply incorporated into various types of semiconductor device sockets and can be shared among various types of semiconductor device sockets.

To achieve the above-mentioned object, a semiconductor device socket according to the present invention comprises a plurality of kinds of pressing mechanisms for pressing a semiconductor device detachably mounted onto a semiconductor device mounting portion, and a contact terminal cartridge selectively and detachably coupled to the lower end of each of the plurality of kinds of pressing mechanisms, having a plurality of substrates for holding a contact terminal group to be electrically connected to terminals of the semiconductor device mounted to the semiconductor device mounting portion.

As apparent from the above description, according to the inventive semiconductor device socket, the contact terminal cartridge is selectively and detachably coupled to the lower end of the plurality of kinds of pressing mechanisms and has a plurality of substrates for holding a contact terminal group electrically connected to the terminals of the semiconductor device mounted to the semiconductor device mounting portion. Accordingly, it is possible to use the contact terminal cartridge in a simple manner commonly to various types of semiconductor device socket without enlarging a size of the socket body.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
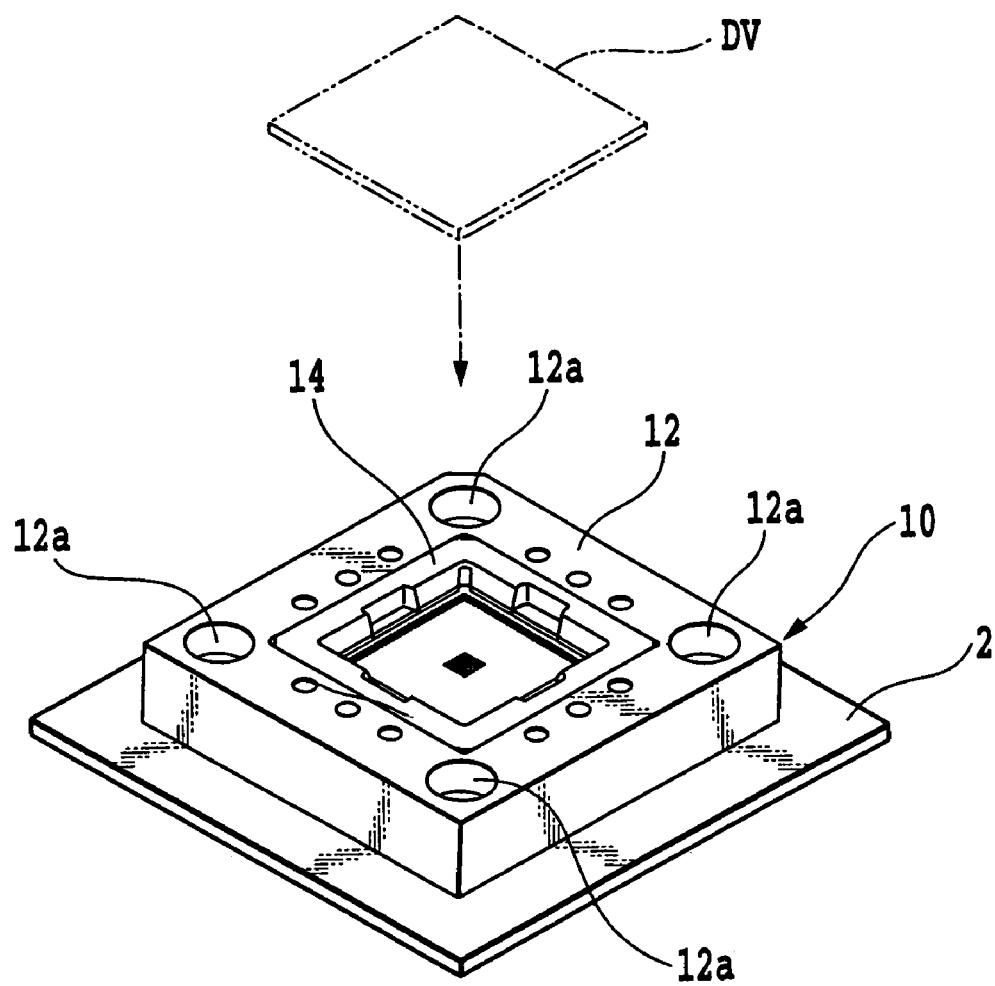
FIG. 1 illustrates a perspective view of an appearance of a first embodiment of a semiconductor device socket according to the present invention together with a printed wiring board.

FIG. 1 illustrates an appearance of a first embodiment of a semiconductor device socket according to the present invention.

A plurality of semiconductor device sockets 10 are arranged on a printed wiring board 2 at positions corresponding to predetermined electro-conductive layers, respectively. In this regard, in FIG. 1, only one semiconductor device socket is shown as a representative of those. The semiconductor device socket 10 is of a type having a pressing mechanism corresponding to a handler of a controlled conveyor robot (not shown). A semiconductor device DV to be tested while being held by the handler is attachable/detachable relative to the semiconductor device socket 10. The semiconductor device DV is, for example, of a generally square-shaped BGA type or LGA type having an electrode surface wherein a plurality of electrode sections are arranged in the vertical and horizontal directions.

The semiconductor device socket 10 includes, as main elements thereof, a casing member 12 for accommodating a probe pin cartridge described later therein and forming a contour, a probe pin cartridge for holding a plurality of probe pins as a contact terminal group modified to be a module in accordance with configurations of the semiconductor device DV, and a movable type positioning member 14 for positioning electrode sections in the semiconductor device DV relative to the respective probe pins in the probe pin cartridge.

Figure 2:
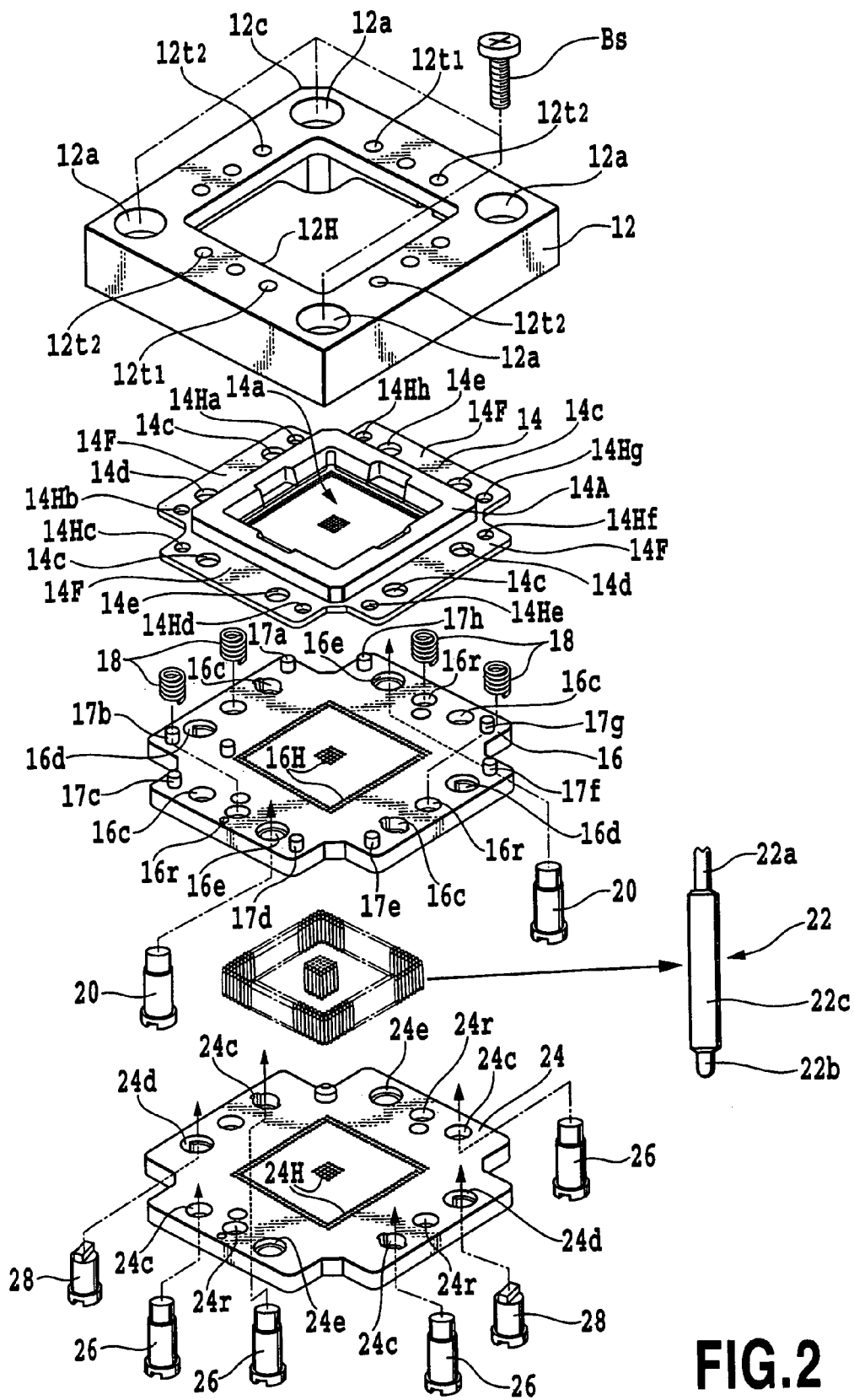
FIG. 2 is an exploded perspective view of the embodiment shown in FIG. 1.

The casing member 12 molded of aluminum alloy is formed in a relatively thin-walled frame-like shape and has an opening 12H at a center thereof into which is inserted a frame-like wall of a positioning member 14 as shown in FIG. 2. At four corners of the casing member 12, through-holes 12a are provided in the thickness direction thereof, for allowing fixing machine screws Bs to pass therethrough. The respective fixing machine screw Bs is inserted into attachment hole in the printed wiring board 2 via the through-hole 12a and fastened by a nut, for example. Thereby, the casing member 12 is secured to the printed wiring board 2.

On the outer circumference of one of the four corners in the casing member 12, a chamfered portion 12c is formed as a mark. On the respective side of the peripheral edge of the opening 12H, a female thread portion 12t2 is formed to be threaded with a cartridge machine screw 26 for fixing the probe pin cartridge described later to the casing member 12.

Figure 4:
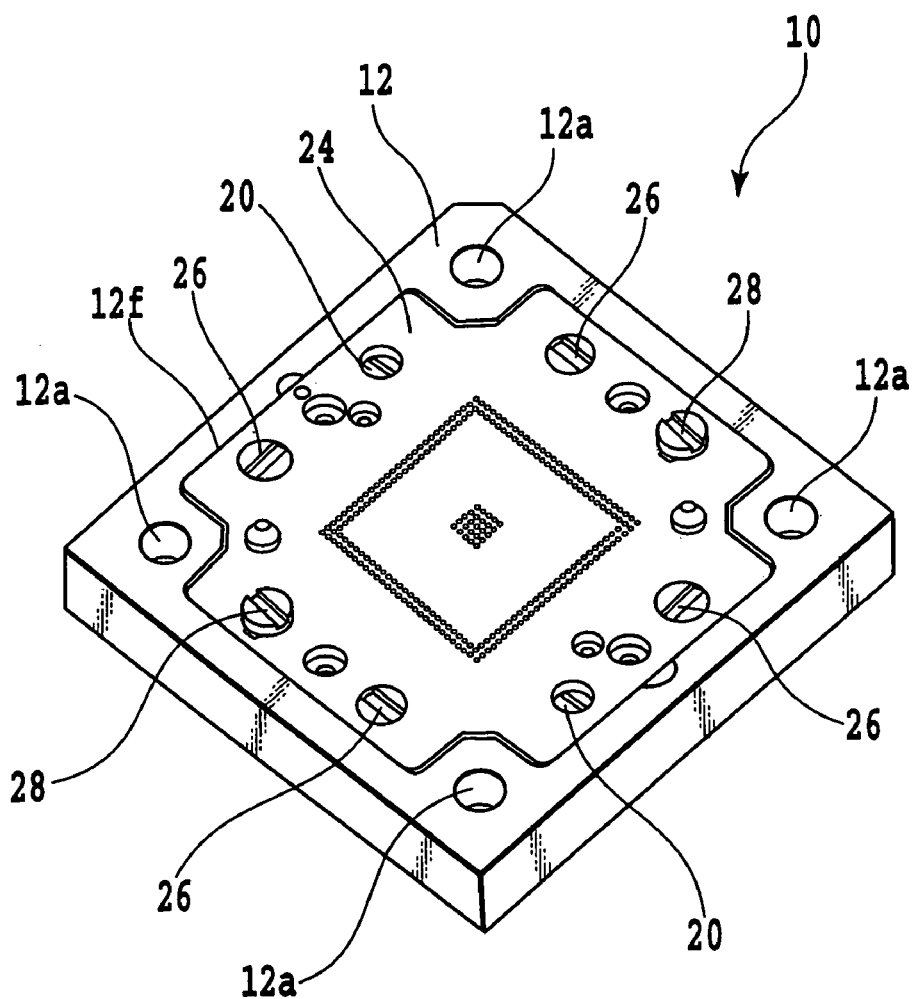
FIG. 4 is a perspective view of the embodiment shown in FIG. 3 as seen from the reverse.

Also, on each of the opposite two sides of the peripheral edge of the opening 12H, a female thread portion 12t1 is formed to be threaded with a machine screw 20 for fixing one of a plurality of substrates forming the probe pin cartridge to the casing member 12. Further, as shown in FIG. 4, on the bottom of the casing member 12, an opening 12f having a shape in correspondence to that of the substrate is formed so that the probe pin cartridge can be inserted from the bottom into the interior thereof.

The positioning member 14 has, at a center thereof, a semiconductor device accommodating portion 14a formed by a frame-like wall. On the bottom of the semiconductor device accommodating portion 14a, through-holes are formed in correspondence to the arrangement of the electrode sections of the semiconductor device DV and an array of probe pins as described later. Thereby, the outer circumference of the mounted semiconductor device DV is positioned by the wall, and the electrode sections of the semiconductor device DV are positioned to the probe pins. At four positions around the wall, there are flanges 14F having apertures 14c into which are inserted the above-mentioned machine screws 26, respectively. At a position on each of the two flanges 14F opposite to the female thread 12t2 in the casing member 12, an aperture 14e into which is inserted the machine screw 20 is formed adjacent to the aperture 14c. At a position on each of the remaining two flanges 14F, an aperture 14d is formed adjacent to the aperture 14c. Further, in the respective. flanges 14F, there are apertures 14Ha, 14Hb, 14Hc, 14Hd, 14He, 14Hf, 14Hg and 14Hh into which are inserted position-adjustment projections described later. These apertures 14Ha to 14Hh are used for the relative positioning of substrates 16 and 24 in the thickness direction. In this regard, since the apertures 14Ha, 14Hc, 14He and Hg among these apertures 14Ha to 14Hh are used not only for the relative positioning of the substrates 16 and 24 in the thickness direction but also for the relative positioning of the positioning member 14 to the substrates 16 and 24 in the surface direction thereof, diameters of the apertures 14Ha, 14Hc, 14He and 14Hg are slightly smaller than those of the other apertures.

Coil springs 18 for biasing the positioning member 14 toward the inner circumference surface of the casing member 12 are provided between the respective flanges 14F and the substrate 16 of the probe pin cartridge described later. Thereby, the positioning member 14 is supported by these coil springs 18 to be movable in the attachment/detachment direction of the semiconductor device DV.

Figure 5:
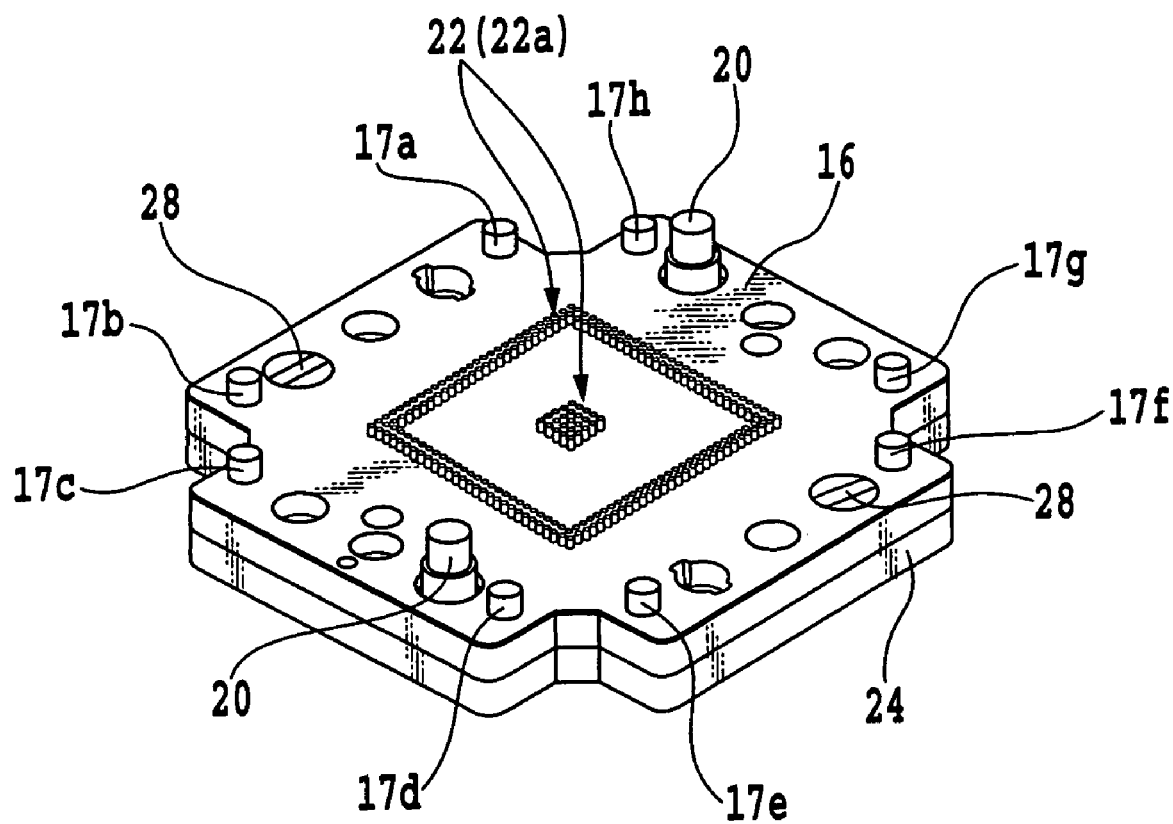
FIG. 5 is a perspective view of an appearance of a probe pin cartridge used for the embodiment shown in FIG. 1.
Figure 6:
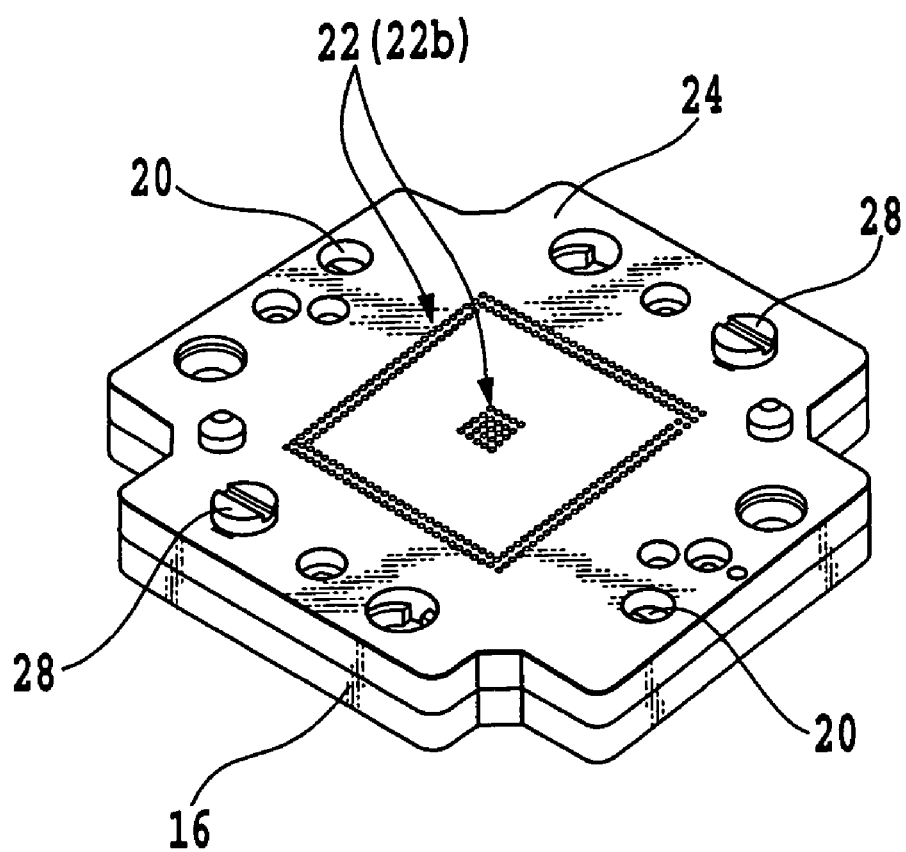
FIG. 6 is a perspective view of the embodiment shown in FIG. 5 as seen from the reverse.

As shown in FIGS. 5 and 6, the probe pin cartridge functioning as a contact terminal cartridge mainly includes a substrate 16 disposed opposite to the positioning member 14, a substrate 24 having the same contour as that of the substrate 16 and disposed directly below the substrate 16, and a plurality of probe pins 22 held by the substrates 16 and 24.

The probe pin 22 includes a contact section 22b having an arcuate distal end to be electrically connected to the respective electrode section of the printed wiring board 2, a contact section 22a having a plurality of microscopic projections arranged at a distal end in the circumferential direction to be electrically connected to the electrode section of the semiconductor device DV, a sleeve 22c for movably accommodating proximal ends of the contact sections 22b and 22a, and a coil spring (not shown) disposed between the proximal ends of the contact sections 22b and 22a within the sleeve 22c to bias the proximal ends of the contact sections 22b and 22a away from each other.

The probe pin 22 has a total length (a probe length), for example, of 5.7 mm and is arranged in correspondence with the arrangement of the electrode section of the semiconductor device DV.

The substrate 16 of a generally cross-shape has, at a center thereof, a through-hole group 16H formed of a plurality of apertures through which pass the contact sections 22a of the probe pins 22. On the respective side of the substrate 16, an aperture 16c through which passes the machine screw 26 is formed. On a side opposite thereto, an aperture 16e through which passes the machine screw 20 is formed in correspondence with the aperture 14e in the positioning member 14 at a predetermined distance from the aperture 16c, respectively. Between the apertures 16c and 16e on the respective side, a hollow 16r into which is inserted one end of the coil spring 18 is formed.

On the other hand, on each of the remaining opposite sides, a hole 16d through which passes the hook screw 28 is formed at a distance from the aperture 16c. On the inner circumference of the hole 16d, a stepped portion selectively engageable with a T-shaped distal end of the hook screw 28 described later is formed in the circumferential direction.

A hollow 16r into which is inserted one end of the coil spring 18 is formed between the holes 16d and 16c.

On the respective sides described above, projections 17a, 17b, 17c, 17d, 17e, 17f, 17g and 17h are provided in correspondence to the apertures 14Ha, 14Hb, 14Hc, 14Hd, 14He, 14Hf, 14Hg and 14Hh, respectively. As described above, the respective projections 17a to 17h are used for the relative positioning of the positioning member 14 to the substrates 16 and 24 in the thickness direction. Particularly, the projections 17a, 17c, 17e and 17g are used for the relative positioning of the positioning member 14 to the substrates 16 and 24 in the surface direction.

The machine screw 26 has a male thread at a tip end thereof and fixes the probe pin cartridge to the above-mentioned casing member 12 via the positioning member 14. The machine screw 20 having a length shorter than that of the machine screw 26 has a male thread at a tip end thereof and fixes solely the substrate 16 to the casing member 12 via the positioning member 14.

The generally cross-shaped substrate 24 has, at a center thereof, a through-hole group 24H formed of a plurality of apertures through which pass the contact sections 22b of the probe pins 22. On the respective side of the substrate 24, an aperture 24c through which passes the machine screw 26 is formed. On a side opposite thereto, an aperture 24e from which exposes a head of the machine screw 20 is formed in correspondence with the aperture 14e in the positioning member 14 at a predetermined distance from the aperture 24c. Between the apertures 24c and 24e on the respective side, a recess 24r is formed.

On the other hand, on each of the remaining opposite sides, an aperture 24d through which passes the hook screw 28 is formed at a distance from the aperture 24c. Between the apertures 24d and 24c, a recess 24r is formed.

The hook spring 28 has a T-shaped portion at a distal end thereof to couple the substrates 16 and 24 together or release the both from each other. When the T-shaped portion is engaged with the stepped portion of the hole 16d in the substrate 16 via the aperture 24d, the substrates 16 and 24 are coupled together. On the other hand, when the T-shaped portion of the hook screw 28 is in a slit of the stepped portion or when it is removed, the substrates 16 and 24 are released from each other. In this regard, the hook screw 28 is used for coupling the substrates 16 and 24 together when the probe pin cartridge is conveyed alone, and removed as described later when the probe pin cartridge is disposed on the printed wiring board 2 (see FIG. 7).

Accordingly, the exchangeable probe pin cartridge does not increase a size of the IC socket and can be simply incorporated into the casing member 12.

Also, since the substrates 16 and 24 have the same contour each other, they are easily manufactured, particularly, by resin-molded in accordance with a maximum number of the electrodes in the semiconductor device to be mounted thereon, whereby a part having the stable accuracy can be produced in a short period at a low cost.

Figure 3:
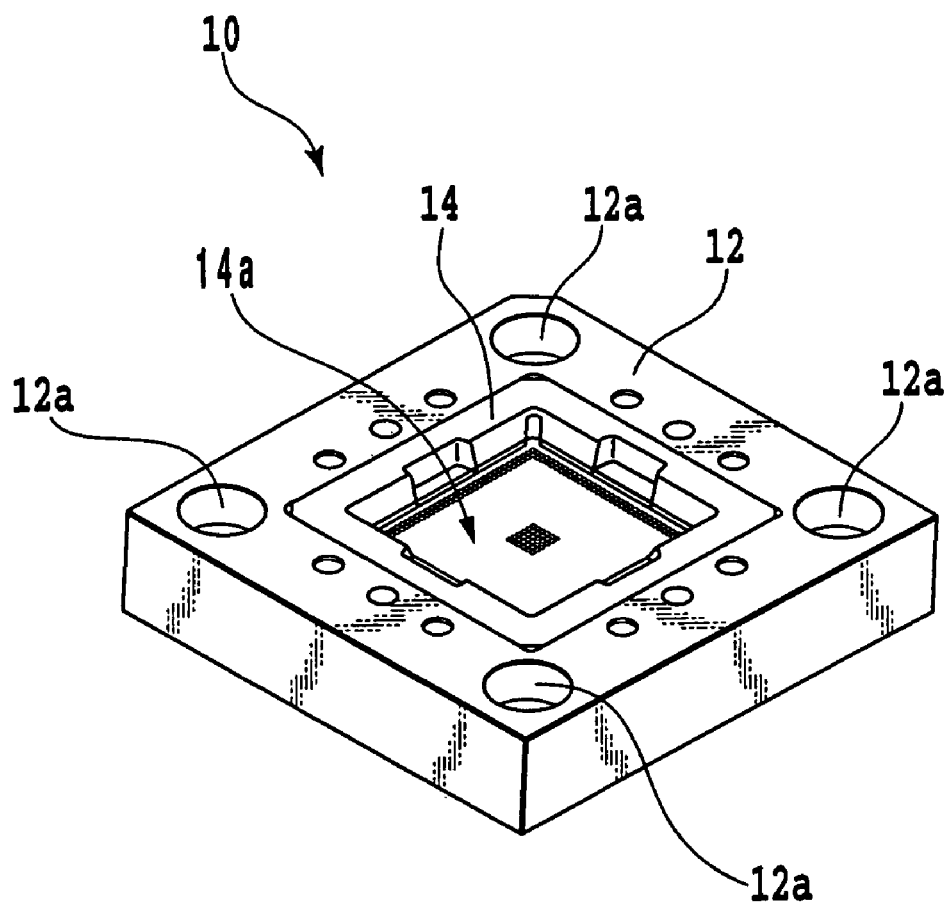
FIG. 3 is a perspective view showing the semiconductor device socket according to the embodiment shown in FIG. 1.
Figure 8:
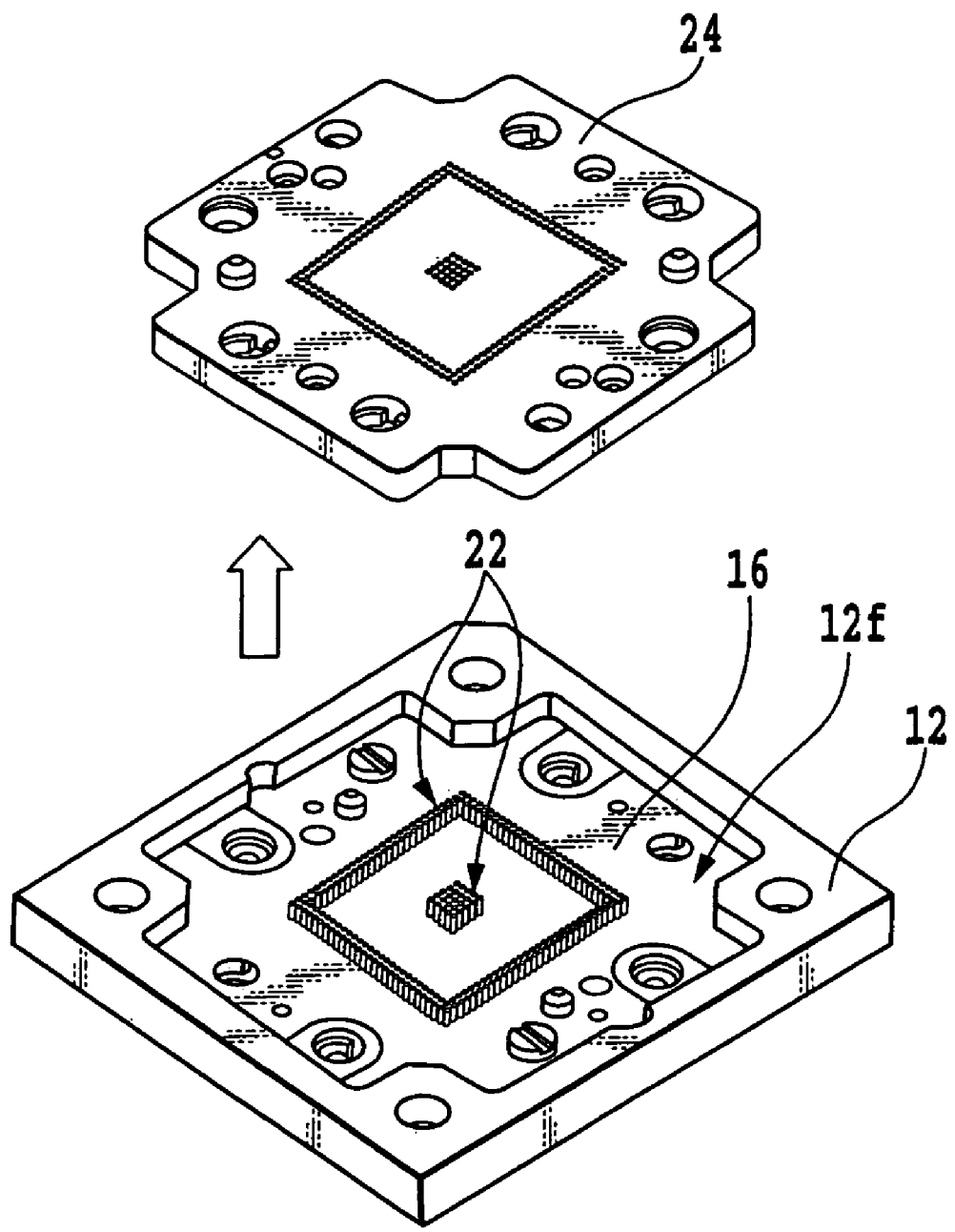
FIG. 8 is a perspective view made available for explaining the procedure for assembling the embodiment shown in FIG. 1.

In such a structure, for example, when the used probe pins 22 in the semiconductor device socket 10 are solely replaced with fresh ones while using the existing substrates 16 and 24, initially the semiconductor device socket 10 is removed from the printed wiring board 2 as shown in FIG. 3, and thereafter, the socket is reversed so that a rear surface of substrate 24 for the probe pin cartridge is visible as shown in FIG. 4. Then, the four machine screws 26 are removed therefrom, whereby the substrate 24 can be apart from the substrate 16 and the casing member 12 as shown in FIG. 8 and removed.

Subsequently, the used probe pins 22 are withdrawn and replaced with the fresh ones, and thereafter, the substrate 24 are fixed again to the substrate 16 and the casing member 12 by the machine screws 26. Thereby, the replacement of the probe pins 22 has been completed.

On the other hand, if the probe pin cartridge is exchanged as a whole from the semiconductor device socket 10, the semiconductor device socket 10 is removed from the printed wiring board 2 in the same manner as described above and shown in FIG. 3, and thereafter, reversed so that the rear surface of the substrate 24 of the probe pin cartridge is visible as shown in FIG. 4. Then, the four machine screws 26 are removed. Also, two screws 20 are unfastened. Thereby, when the semiconductor device socket 10 is reversed again to be in the original state, the whole of the used probe pin cartridge can be apart from the casing member 12 and removed.

Subsequently, the coil springs 18 are removed from the used probe pin cartridge, and thereafter, a fresh probe pin cartridge is prepared as shown in FIGS. 5 and 6.

Figure 9:
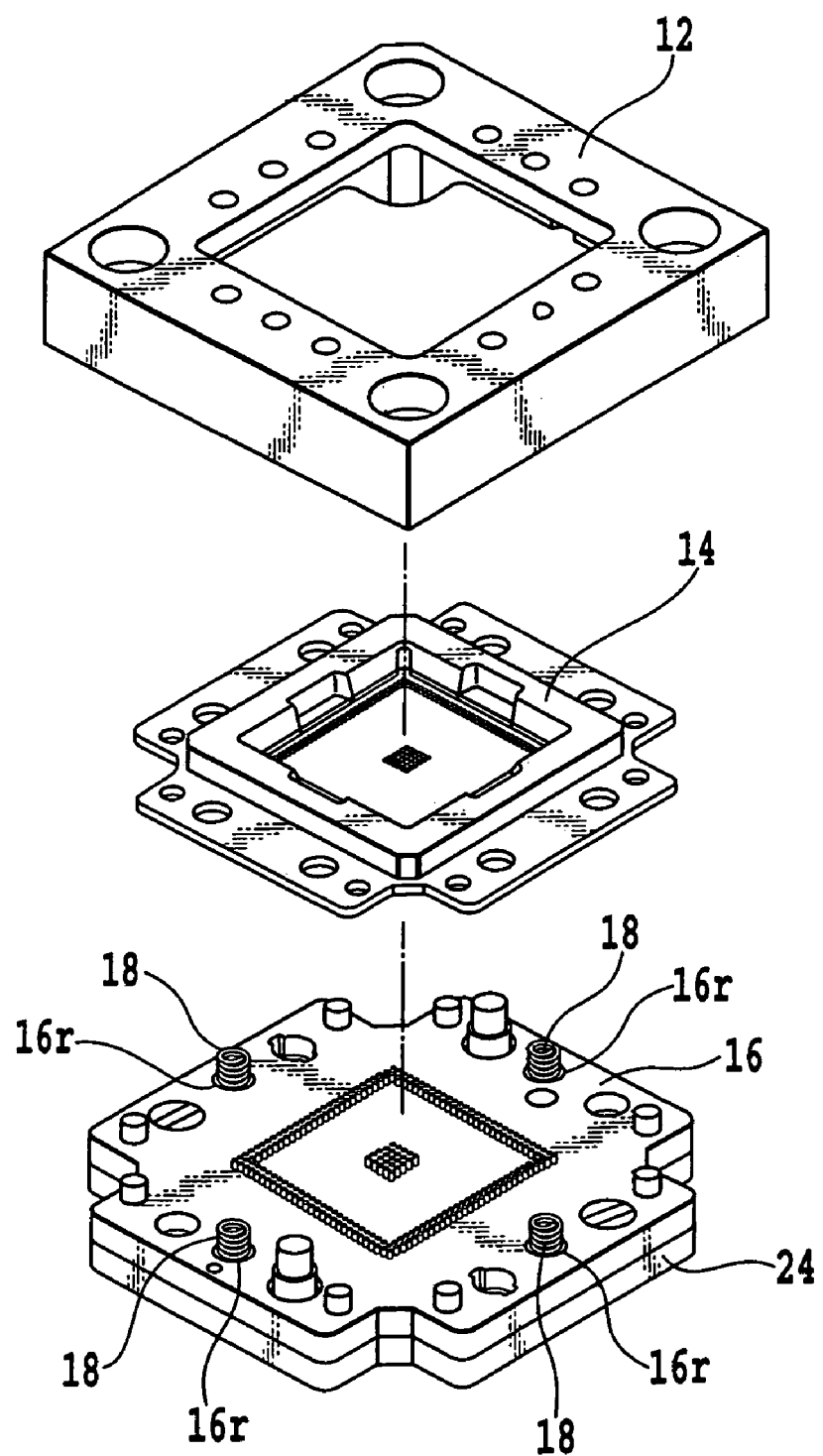
FIG. 9 is an exploded perspective view made available for explaining the procedure for assembling the embodiment shown in FIG. 1.

Subsequently, the removed coil springs 18 are inserted into the hollows 16r in the fresh probe pin cartridge as shown in FIG. 9, and thereafter, the probe pin cartridge is assembled to the casing member 12 together with the positioning member 14. In this regard, FIG. 9 illustrates a state wherein the fresh probe pin cartridge is mounted as a whole.

Figure 7:
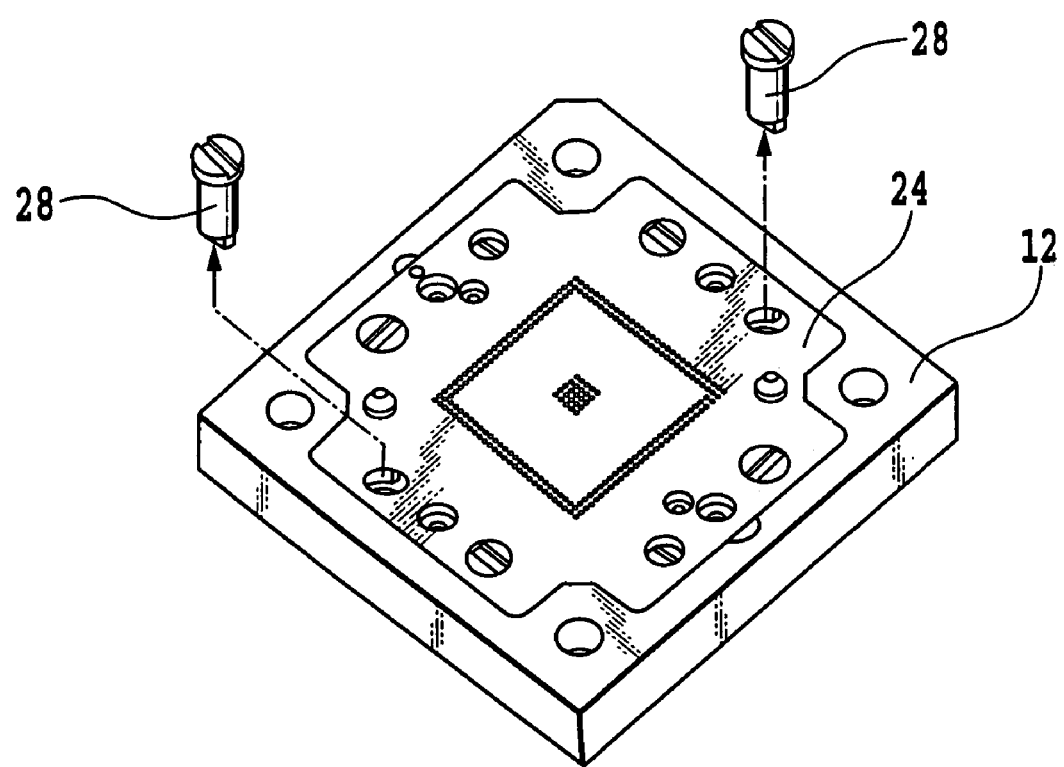
FIG. 7 is a perspective view made available for explaining the procedure for assembling the embodiment shown in FIG. 1.

Then, the casing member 12 assembled with the probe pin cartridge and the positioning member 14 is reversed as shown in FIG. 4, and thereafter, the machine screws 20 and 26 are screwed into the female threads in the casing member 12 as described above. At that time, as shown in FIG. 7, the hook screws 28 are removed. Thereby, the replacement of the probe pin cartridge has been completed.

In such a manner, it is possible to easily and quickly carry out the replacement of the probe pins or the whole of the probe pin cartridge.

Figure 10:
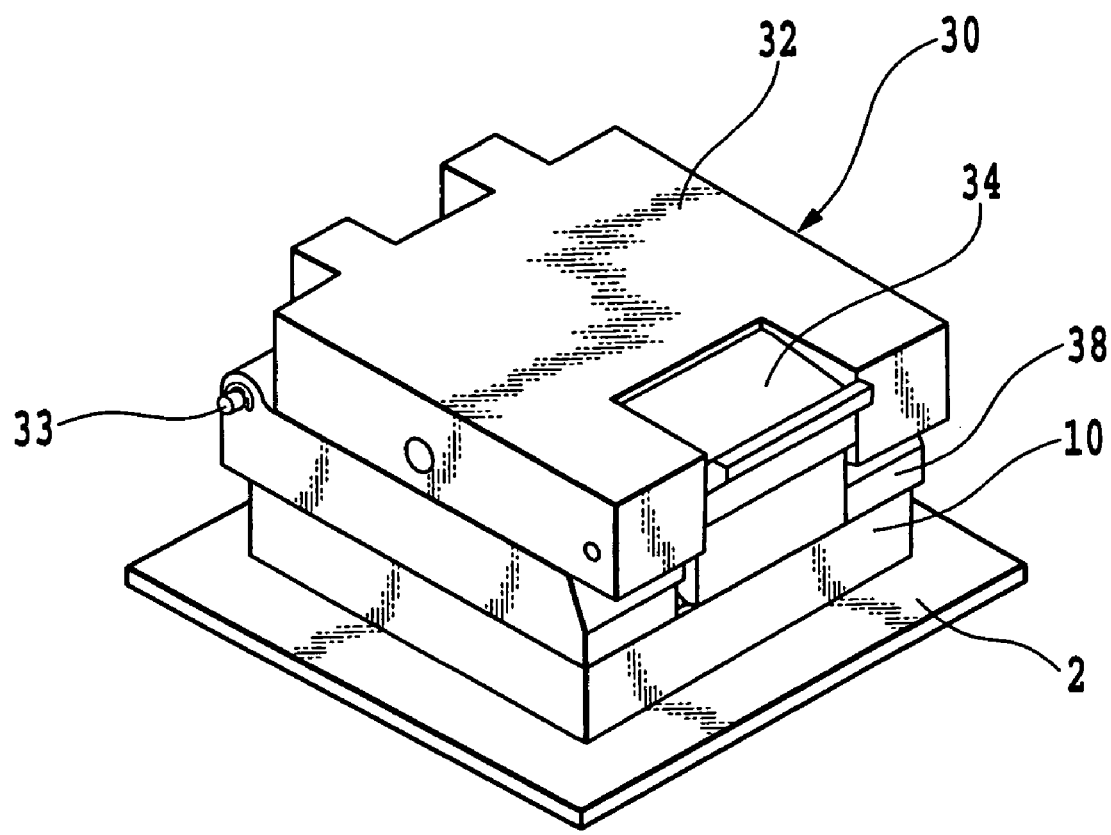
FIG. 10 illustrates a perspective view of an appearance of a second embodiment of a semiconductor device socket according to the present invention together with a printed wiring board.

FIG. 10 illustrates an appearance of a second embodiment of a semiconductor device socket according to the present invention.

The semiconductor device socket shown in FIG. 10 is of a clam shell type.

In the embodiment shown in FIG. 10 and those described later, the same reference numerals are used for indicating the same components, and the explanation thereof will be eliminated.

In FIG. 10, a presser mechanism 30 including a base member 38 and a lid member 32 is fixed to the upper end surface of the semiconductor device socket 10 disposed on the printed wiring board 2. Accordingly, the above-mentioned semiconductor device socket 10 is commonly used also in the clam shell type socket.

The presser mechanism 30 includes the base member 38 placed on the upper end surface of the semiconductor device socket 10, and the lid member 32 hinged to an end of the base member 38 and having a presser body 36 for pressing an electrode surface of the semiconductor device onto the above-mentioned probe pins 22.

The outer dimension of the base member 38 is generally equal to that of the semiconductor device socket 10 (the casing member 12). At a center of the base member 38, an opening 38b is formed in communication with the semiconductor device accommodating portion 14a in the positioning member 14. At four corners on the periphery of the opening 38b, apertures 38a into which are inserted fixing machine screws Bs are provided in correspondence with the through-holes 12a in the casing member 12. Thereby, the base member 38 is fixed to the printed wiring board 2 by inserting the fixing machine screws Bs into the apertures 38a, the through-holes 12a and the through-holes in the printed wiring board 2 and fastening the machine screws by nuts Nu.

Figure 11:
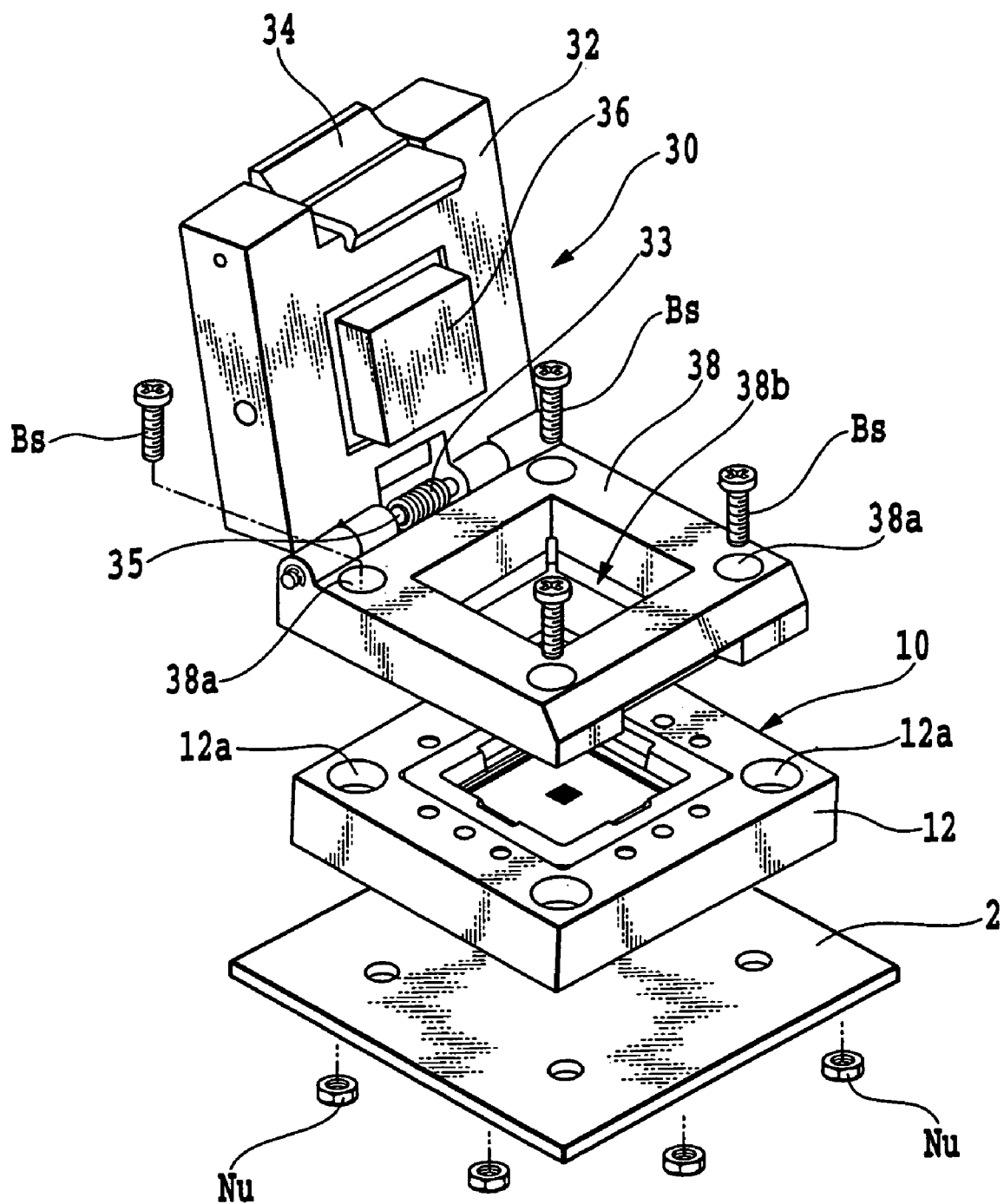
FIG. 11 is an exploded perspective view of the embodiment shown in FIG. 10.

The lid member 32 is hinged at one end to the base member 38 via a supporting shaft 35. A coil spring 33 is wound around the supporting shaft 35 so that the other end of the lid member 32 is biased away from the base member 38. A latch member 34 is hinged to the other end of the lid member 32 so that the lid member 32 is held on the base member 38 as shown in FIG. 10 or the lid member 32 is in a released state as shown in FIG. 11. One end of the latch member 34 is hinged to the lid member 32, while the other end thereof is selectively engaged with an engagement portion of the base member 38.

In a central opening on the inner surface of the lid member 32, the presser body 36 is provided in a movable manner. The presser body 36 is biased by a plurality of coil springs (not shown) arranged in the opening so that an outer end thereof is away from the lid member 32.

In this structure, upon testing the semiconductor device, the semiconductor device is mounted in a state shown in FIG. 11 to the semiconductor device accommodating portion 14a through the opening 38b of the base member 38. Then, as shown in FIG. 10, the lid member 32 is moved to close the opening 38b. Under the condition, a predetermined test is carried out.

When the probe pins are replaced or the probe pin cartridge is replaced as a whole, the assembly is disassembled as shown in FIG. 11, and thereafter, the replacement operation is carried out as described above.

Accordingly, the replacement operation can be simply and quickly carried out in the same manner as in the above-mentioned embodiment.

Figure 12:
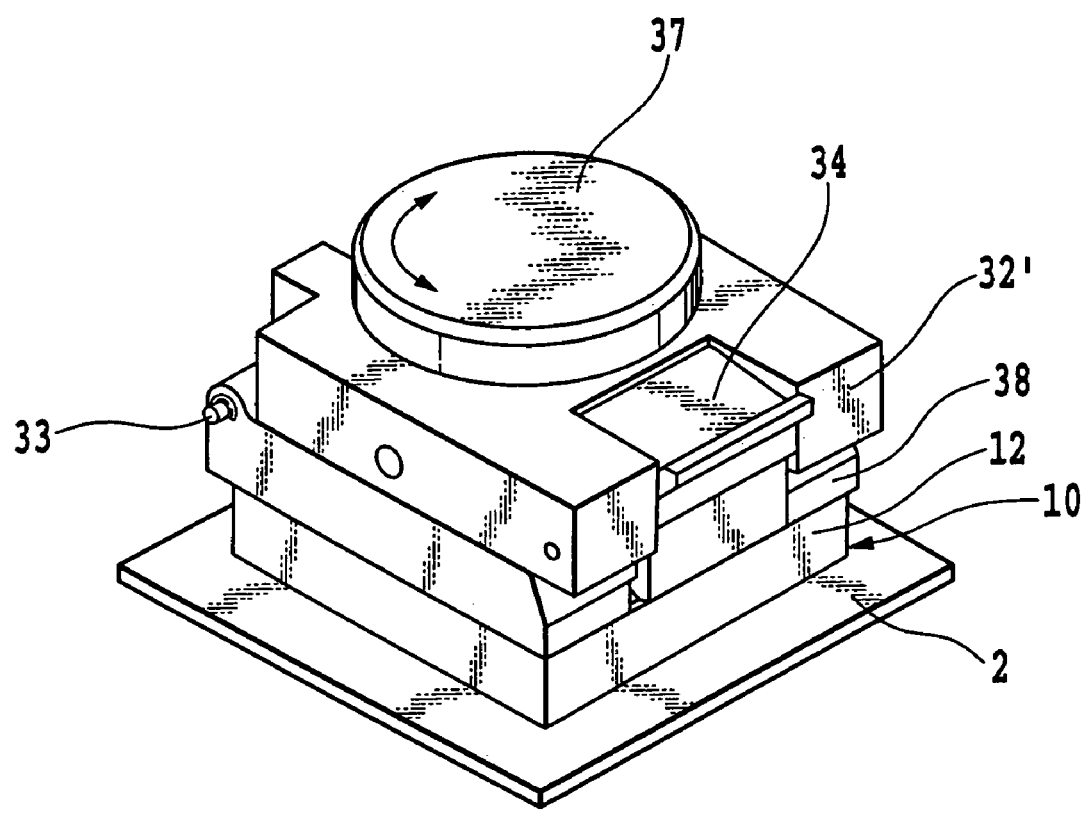
FIG. 12 is a perspective view of one modification of the embodiment shown in FIG. 10.

FIG. 12 illustrates a modification of the embodiment shown in FIGS. 10 and 11. In the modification shown in FIG. 12, the same reference numerals are used for denoting the same elements as in the embodiment shown in FIGS. 10 and 11, and the explanation thereof will be eliminated In FIG. 12, an operation knob 37 for manually adjusting the pressure of the presser body 36 is further provided. The operation knob 37 is coupled to a proximal end of the presser body 36, for example, via a screw mechanism. Thereby, when the operation knob 37 is rotated clockwise in the direction indicated by an arrow at a predetermined angle, an external front end of the presser body 36 is projected by a predetermined amount toward the opening 38b. Thereby, the pressure of the presser body 36 increases. On the other hand, if the operation knob 37 is rotated counterclockwise at a predetermined angle as shown by an arrow, the external front end of the presser boy 36 is retreated into the lid member 32 to be away from the opening 38b. Accordingly, the pressure of the presser body 36 reduces.

Figure 13:
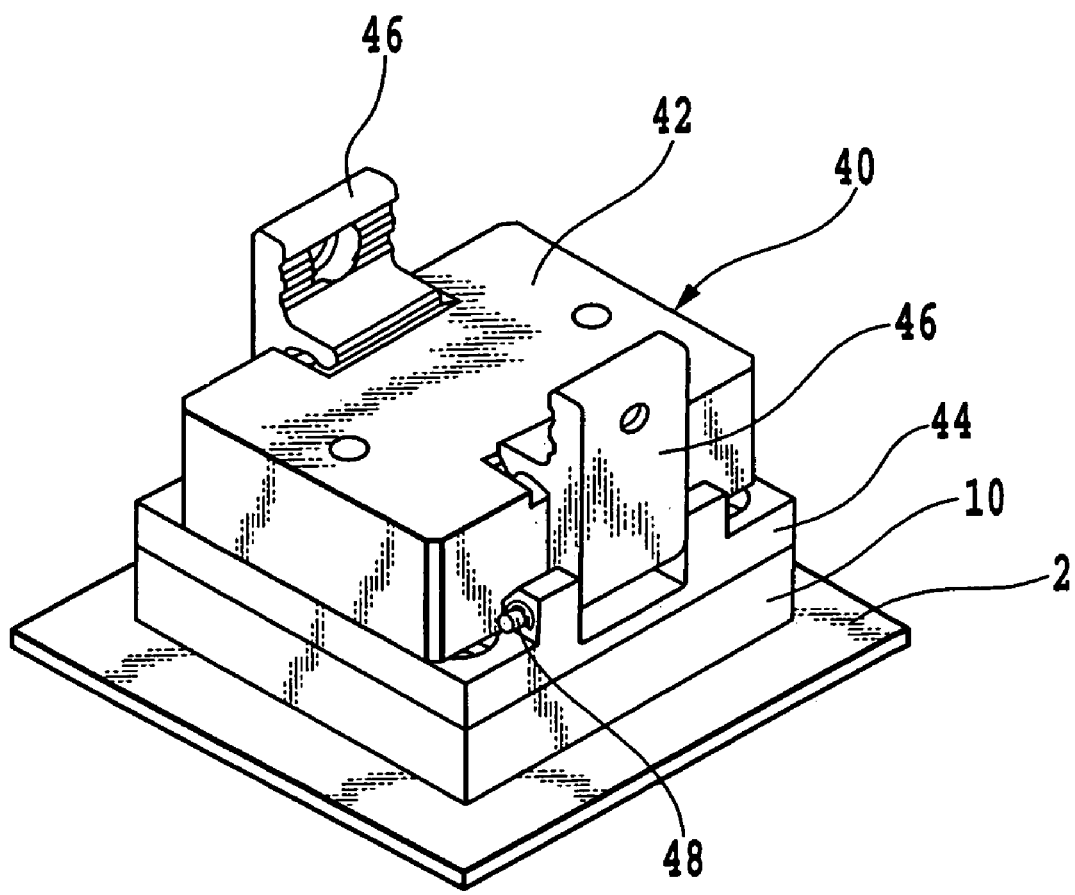
FIG. 13 illustrates a perspective view of an appearance of a third embodiment of a semiconductor device socket according to the present invention together with a printed wiring board.
Figure 14:
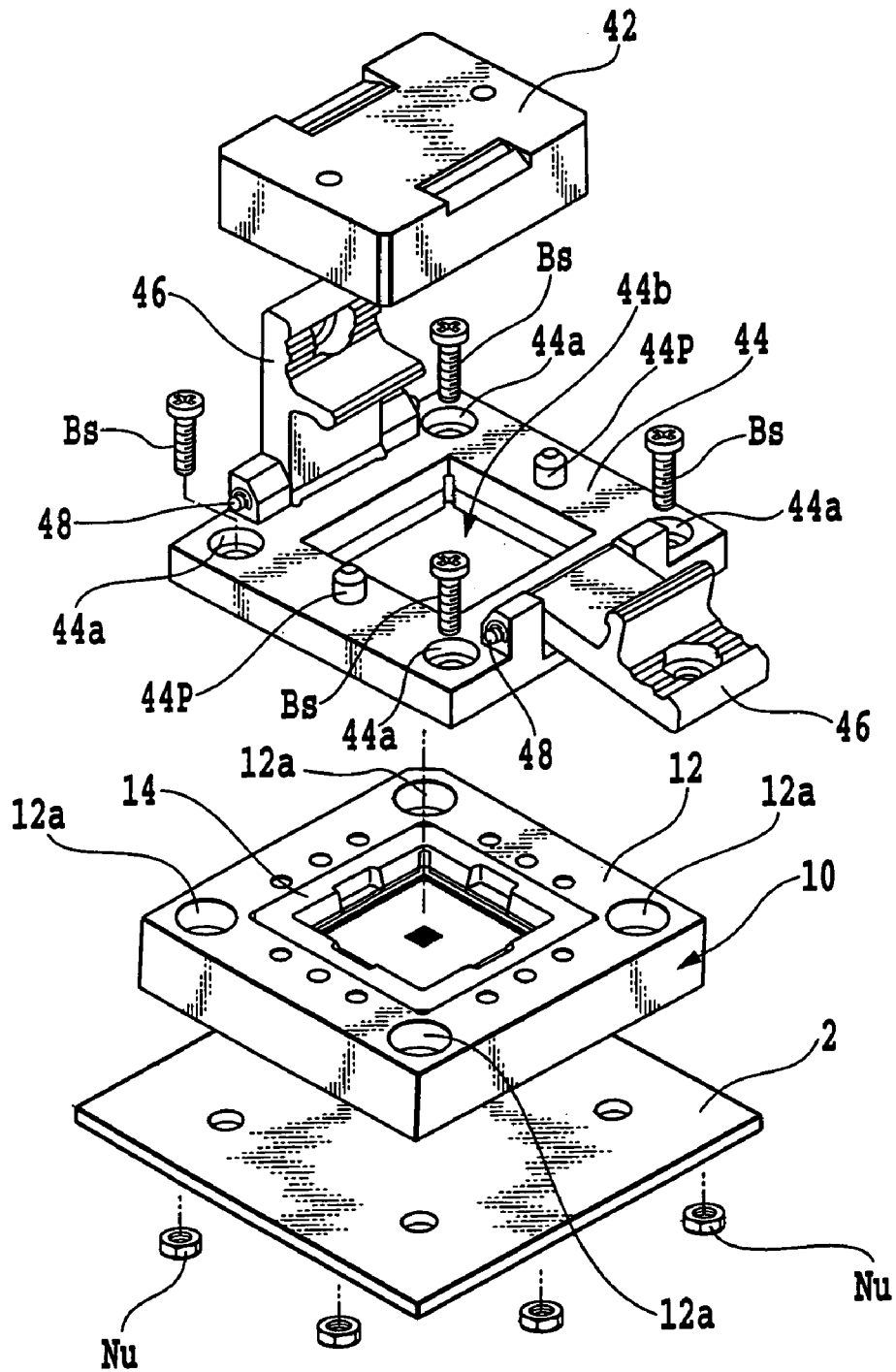
FIG. 14 is an exploded perspective view of the embodiment shown in FIG. 13.

FIGS. 13 and 14 illustrate an appearance of a third embodiment of a semiconductor device socket according to the present invention.

The embodiment shown in FIGS. 13 and 14 is a so-called lid type manual socket.

In FIG. 13, a pressing mechanism 40 including a base member 44 and a lid member 42 is fixed, as an adaptor, to the upper end surface of the semiconductor device socket 10 disposed on the printed wiring board 2. Accordingly, in the lid type manual socket, the semiconductor device socket 10 can be commonly used.

As shown in FIG. 14, the pressing mechanism 40 includes a base member 44 placed on the upper end surface of the semiconductor device socket 10, and a lid member 42 placed on the upper surface of the base member 44, for pressing the electrode surface of the mounted semiconductor device to the probe pins 22 described above.

The outer dimension of the base member 44 is generally equal to that of the semiconductor device socket 10 (the casing member 12). At a center of the base member 44, an opening 44b is formed in communication with the semiconductor device accommodating portion 14a in the positioning member 14. At four corners on the periphery of the opening 44b, apertures 44a into which are inserted fixing machine screws Bs are provided in correspondence with the through-holes 12a in the casing member 12. Thereby, the base member 44 is fixed to the printed wiring board 2 by inserting the fixing machine screws Bs into the apertures 44a, the through-holes 12a and the through-holes in the printed wiring board 2 and fastening the machine screws by nuts Nu.

Between the apertures 44a and 44a formed on one pair of opposite sides in the base member 44, positioning pins 44P engaged with apertures in the lid member 42 described later are provided, respectively. Between the apertures 44a and 44a formed on the other pair of opposite sides, latch members for holding or releasing the lid member 42 relative to the base member 44 are provided, respectively. The respective latch member 46 is hinged to a supporting shaft 48 provided in the base member 44. The latch member 46 has a protrusion selectively engageable with an indent formed in the lid member 42.

Indents engaged with the protrusions of the latch members 46 are provided on the opposite sides of the lid member 42. Thereby, when the protrusions are engaged with the indents, the latch members 46 hold the lid member 42 on the base member 44 as shown in FIG. 13. On the other hand, when the protrusions are not engaged with the indents, the latch members 46 release the lid member 42 as shown in FIG. 14.

In this structure, upon testing the semiconductor device, the opening 44b of the base member 44 is initially in an open state, and then the semiconductor device is mounted to the semiconductor device accommodating portion 14a of the positioning member 14 through the opening 44b of the base member 44. Subsequently, as shown in FIG. 13, the opening 44b is close by the lid member 42, under which condition, a predetermined test is carried out.

Upon the replacement of the probe pin or the probe pin cartridge as a whole, after the assembly has been disassembled, as shown in FIG. 14, the replacement operation is carried out in the same manner as in the above-mentioned embodiment.

Accordingly, it is possible to simply and quickly carry out the replacement operation in the same manner as in the above-mentioned embodiment.

Figure 15:
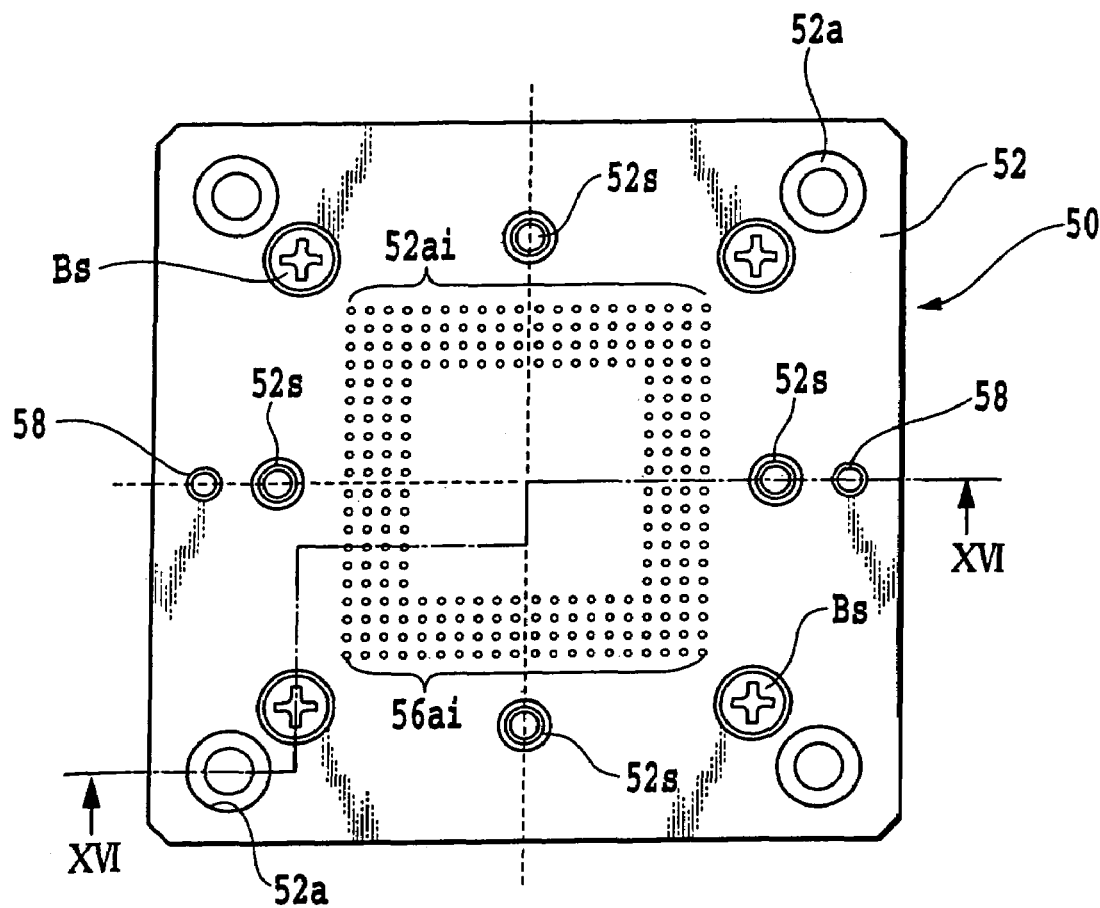
FIG. 15 is a plan view of a fourth embodiment of a semiconductor device socket according to the present invention.
Figure 16:
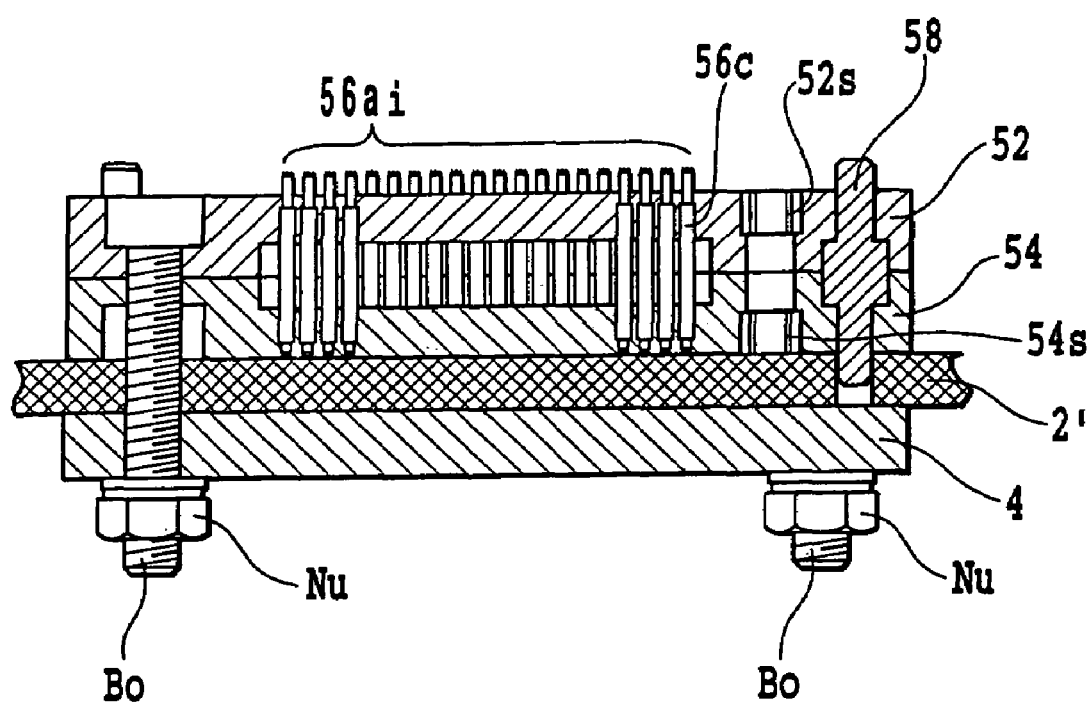
FIG. 16 is a sectional view of the embodiment shown in FIG. 15.

FIGS. 15 and 16 illustrate a fourth embodiment of a semiconductor device socket according to the present invention.

Figure 17:
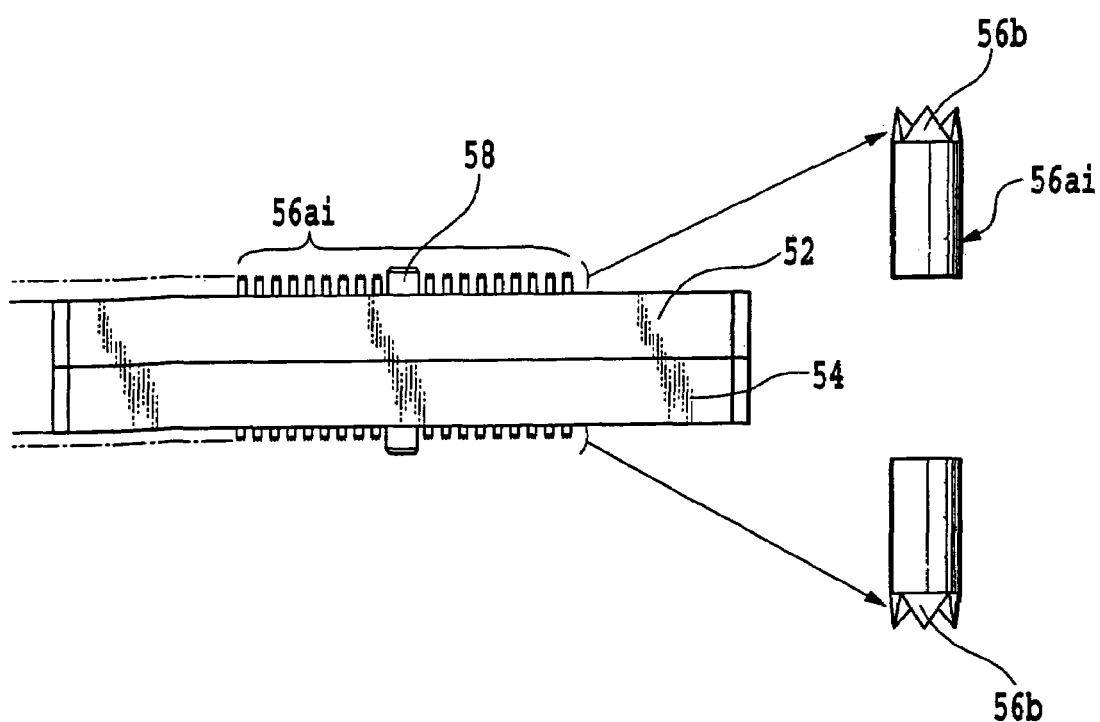
FIG. 17 illustrates a view showing an appearance of a substrate in the embodiment shown FIG. 15.
Figure 18:
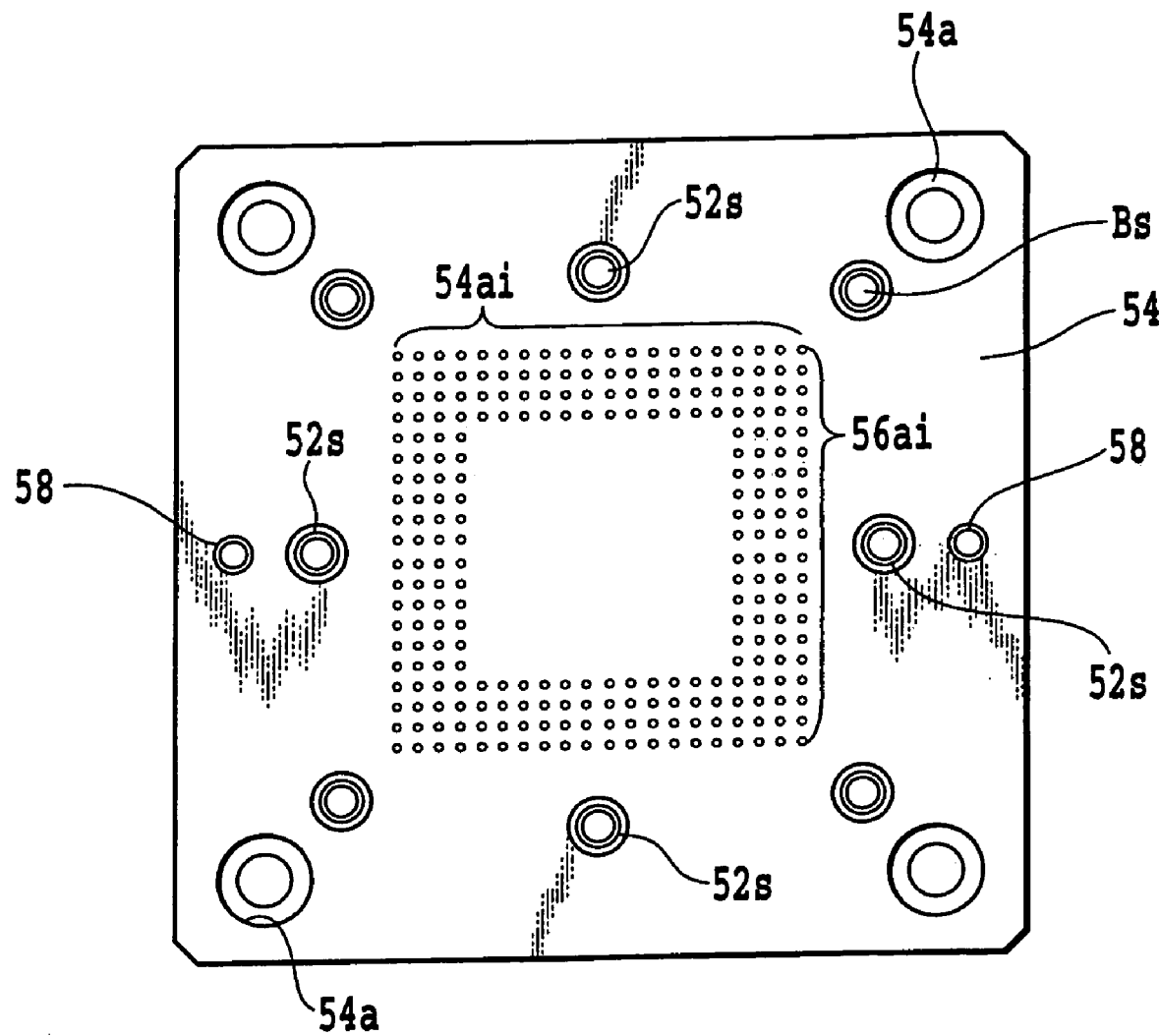
FIG. 18 is a plan view of the embodiment shown in FIG. 15 as seen from the reverse.

The probe pin cartridge of the embodiment shown in FIG. 5 include a plurality of probe pins 22 held by the substrates 16 and 24, wherein the probe pin 22 has an arcuate end contact section 22b to be electrically connected to the printed wiring board 2 and a contact section 22a having a plurality of micro-projections arranged in the circumferential direction of a distal end thereof to be electrically connected to the electrode sections of the semiconductor device. On the other hand, a probe pin 56ai shown in FIGS. 16 and 17 is provided at opposite ends thereof with contact sections 56b of the same shape to be electrically connected to the electrode section of the semiconductor device and a conductive section of the printed wiring board 2. Also, substrates 52 and 54 of substantially the same shape are provided.

As shown in FIGS. 15 and 16, the probe pin cartridge 50 mainly includes substrates 52 and 54 disposed opposite to each other, and a plurality of probe pins 56ai (i=1 to n, n is a positive integer) held by the substrates 52 and 54.

The probe pins 56ai are arranged in correspondence to the arrangement of the mounted electrode sections in the semiconductor device. The probe pin 56ai has contact sections 56b at opposite ends thereof to be electrically connected to the electrode sections in the semiconductor device and the conductive section in the printed wiring board 2, a sleeve 56c for accommodating two proximal ends of the contact sections 56b in a movable manner and a coil spring (not shown) disposed between the proximal ends of the contact sections 56b to bias the proximal ends of the contact section 56b away from each other. Each of the same-shaped contact sections 56b has a plurality of micro-projections arranged in the circumferential direction at a tip end thereof. In this regard, the contact section 56b is projected outward by the same length from the surface of the substrate 52, 54.

Since the substrates 52 and 54 are generally of the same structure to each other, the description will be made solely on the substrate 52, and that of the substrate 54 will be eliminated.

The generally rectangular substrate 52 has a through-hole group 52ai at a center thereof, consisting of a plurality of apertures through which pass the contact sections 56b of the respective probe pins 56ai. On each side of the substrate 54, an aperture 52a through which passes a machine screw Bo is formed. Thereby, the hole 52a is inserted into the aperture 52a, an aperture 54a in the substrate 54, an aperture in the printed wiring board 2' and an aperture in a reinforcement plate 4 disposed on the lower surface of the printed wiring board 2', and fastened by a nut Nu. Thus, the substrates 52 and 54 are fixed to the printed wiring board 2'.

At four positions on the periphery of the through-hole group 52ai, female threads 52S screw-engaged with screws for attaching the pressing mechanism or others in the aforementioned embodiment are provided on center lines. An aperture into which is inserted a positioning pin 58 is formed adjacent to the respective female thread 52S. The positioning pin 58 for positioning the handler or the printed wiring board 2' has a large-diameter portion in an intermediate area. The large-diameter portion of the positioning pin 58 is engaged with a recess formed in the interior of the substrates 52 and 54. One end of the positioning pin 58 projects from the surface of the substrate 52, and the other end of the positioning pin 58 is engaged with the aperture in the printed wiring board 2'.

Further, an aperture through which passes a countersunk machine screw Bs1 for coupling the substrates 52 and 54, is formed adjacent to the aperture 52*a*. In this regard, a female thread is formed in the substrate 54 in correspondence to that aperture.

Figure 19:
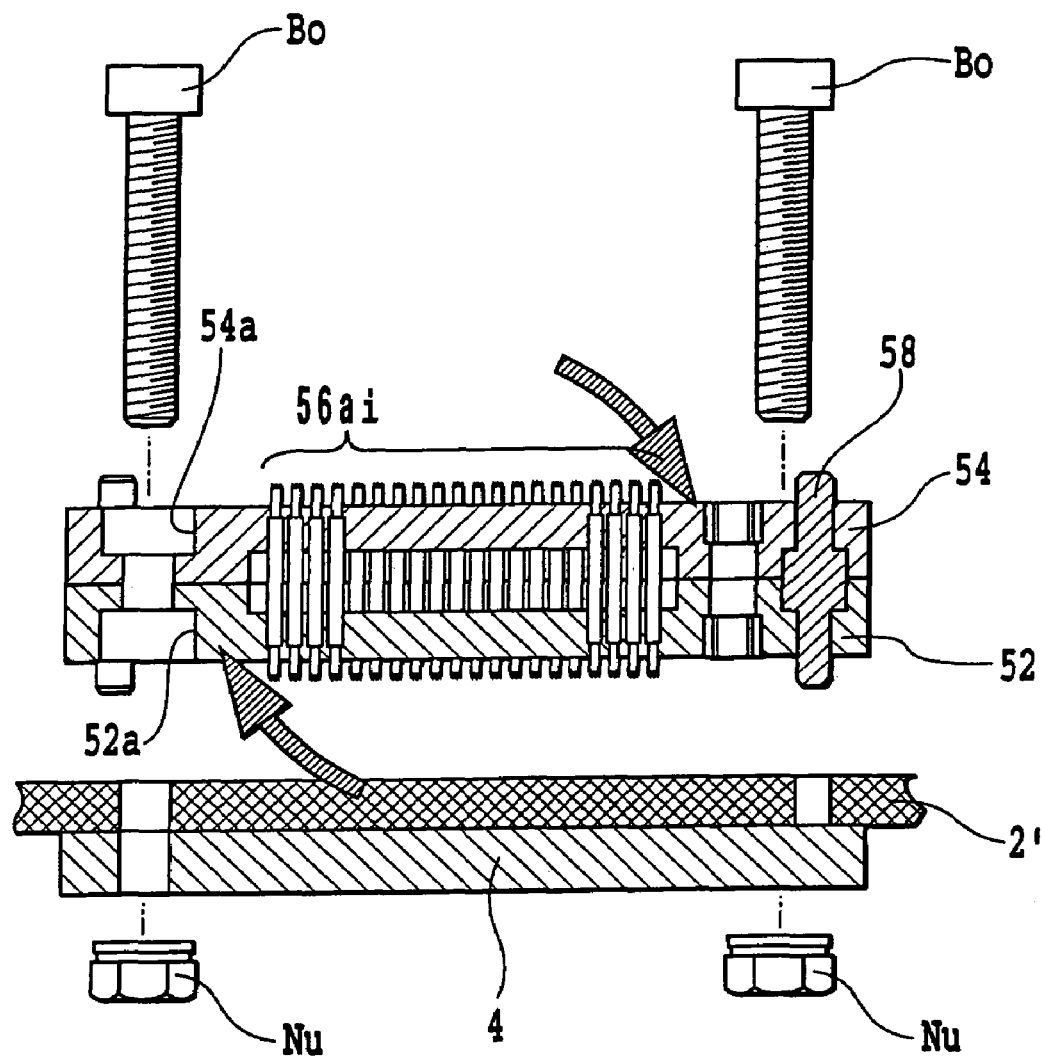
FIG. 19 is a sectional view made available for explaining the procedure for assembling the embodiment shown in FIG. 15.

In this structure, if the stable electric connection has not been obtainable in one of the contact sections 56*b* in the probe pin 56*ai*, for example, by the repeated contact thereof with the electrode section of the semiconductor device, such as a solder ball, due to the adhesion of solder to the contact section 56*b*, the probe pin cartridge is once removed and the substrate 52 is reversed to be in contact with the printed wiring board 2' as shown in FIG. 19, and fixed again. Thereby, the contact section 56*b* free from the adhesion of solder in the substrate 54 can be brought into contact with the electrode sections of the semiconductor device during the test. Upon reversing, the solder or others adhered to the contact section 56*b* of the probe pin 56*ai* in the substrate 52 may be removed.

Figure 20:
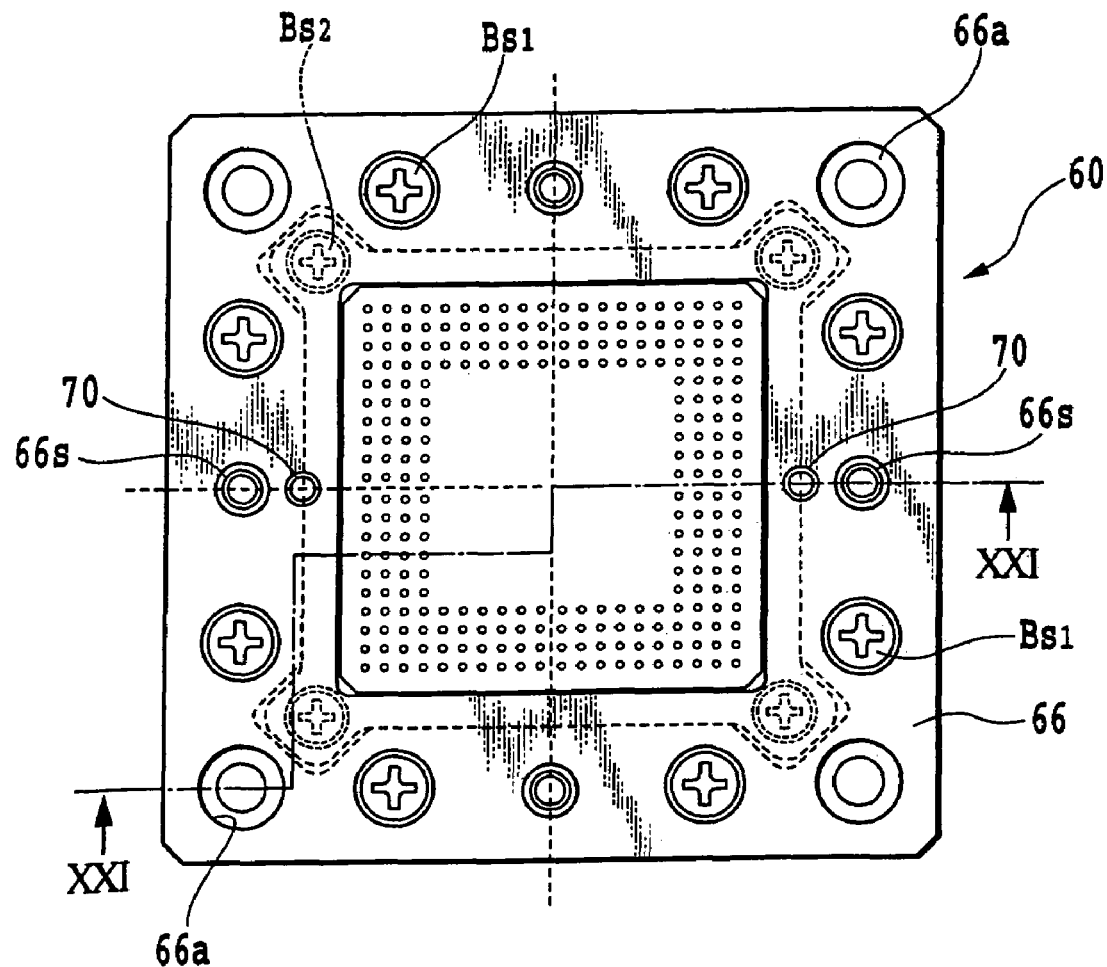
FIG. 20 is a plan view of a fifth embodiment of a semiconductor device socket according to the present invention.
Figure 21:
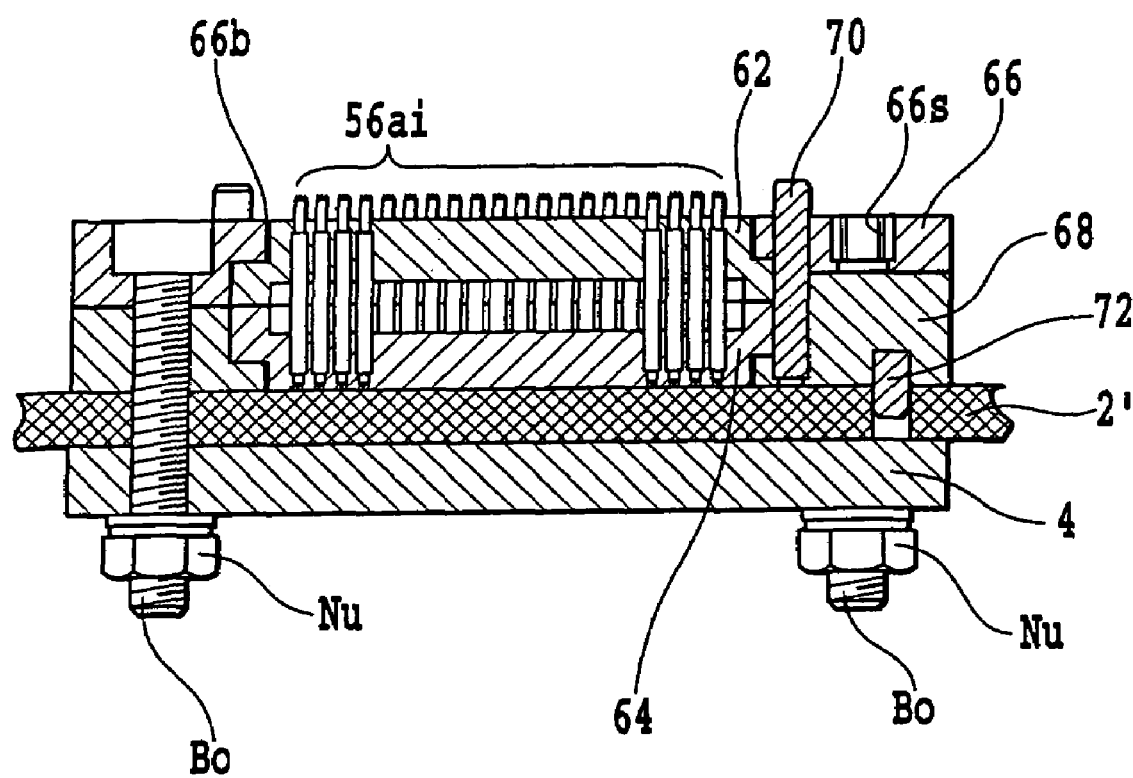
FIG. 21 is a sectional view of the embodiment shown in FIG. 20.
Figure 22:
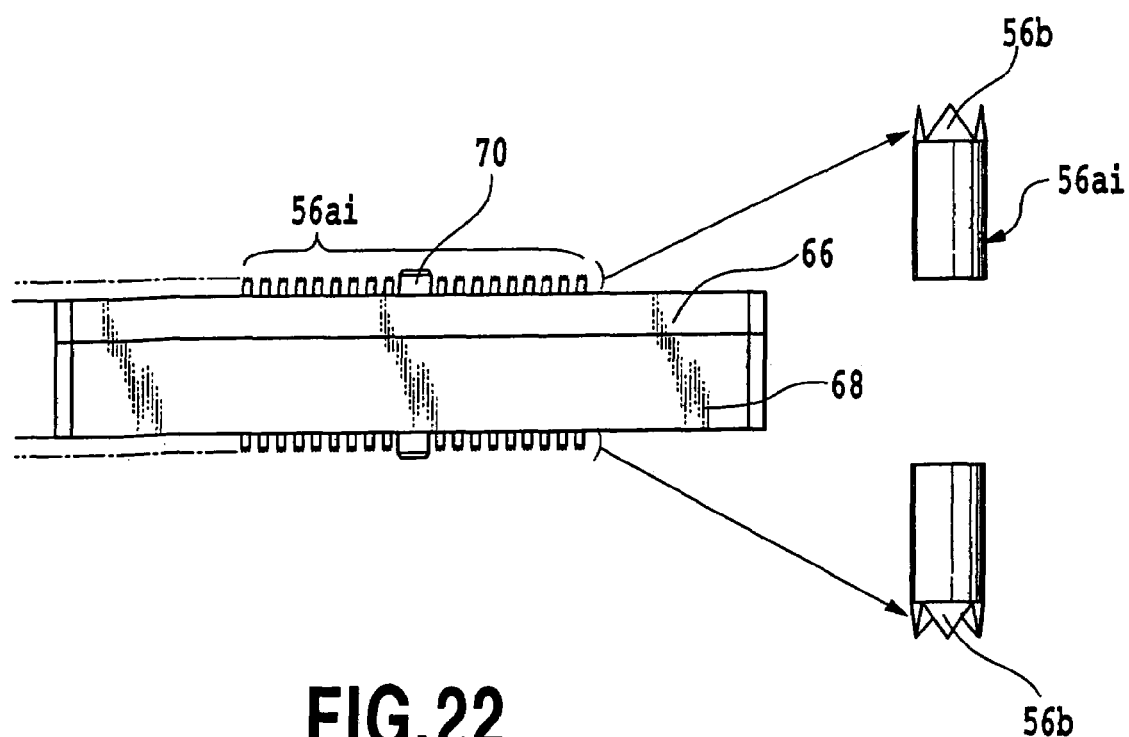
FIG. 22 is a view showing an appearance of a cover member and a base of the embodiment shown in FIG. 20.

FIGS. 20 and 21 illustrate a fifth embodiment of a semiconductor device socket according to the present invention.

Part for supporting the probe pins 56*ai* is formed in integral with the substrates 52 and 54 in the embodiment shown in FIG. 15. Contrarily, in the embodiment shown in FIG. 20, a substrate portion for supporting the probe pins 56*ai* is solely detachable from the base.

In this regard, in FIGS. 20 and 21, the same reference numerals are used for denoting the same elements as in the embodiment shown in FIG. 15, and the redundant explanation thereof is eliminated.

In FIG. 20, the semiconductor device socket includes a base 68 having an accommodating portion 68*a* for accommodating a probe pin cartridge 60 described later, a cover member 66 for holding the probe pin cartridge 60 in association with the base 68, and the probe pin cartridge 60.

The generally rectangular cover member 66 has an opening 66*b* at a center thereof, through which pass contact sections 56*b* of the respective probe pins 56*ai* and a stepped portion of a substrate 62 described later.

On the sides of the cover member 66, apertures 66*a* through which pass machine screws Bo for fixing the base are provided at four corners, respectively.

At four positions on the periphery of the opening 66*b*, female threads 66S are provided on center lines, screw-engaged with screws for attaching the pressing mechanism or others in the above-mentioned embodiment. An aperture into which is inserted a positioning pin 70 is formed adjacent to the respective female thread 66S. One end of the positioning pin 70 for the handler, for example, is fixed to the base 68. Further, an aperture through which passes a countersunk screw Bs1 for coupling the cover member 66 to the base 68 is formed adjacent to the aperture 66*a*. In this regard, as shown in FIG. 23, female threads are formed in the base 68 in correspondence to those apertures.

Figure 23:
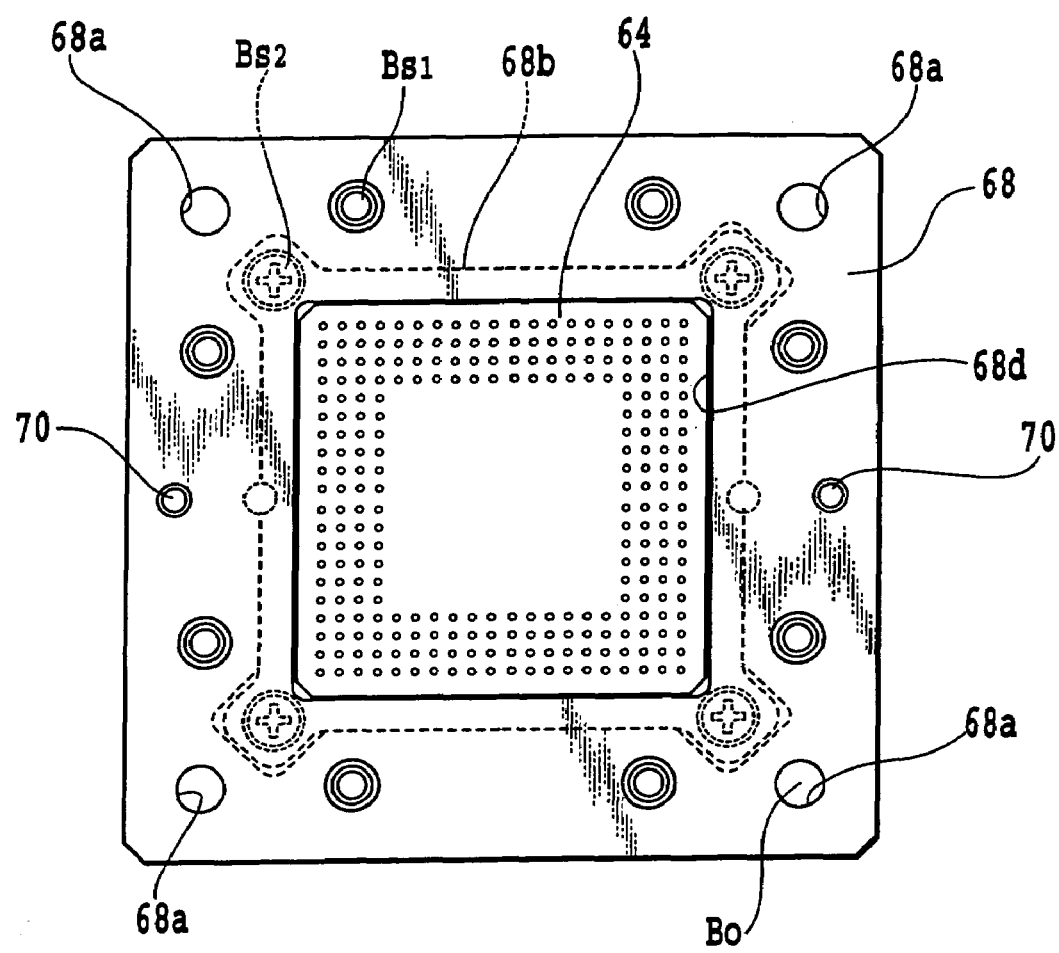
FIG. 23 is a plan view of the embodiment shown in FIG. 20 as seen from the reverse.
Figure 24:
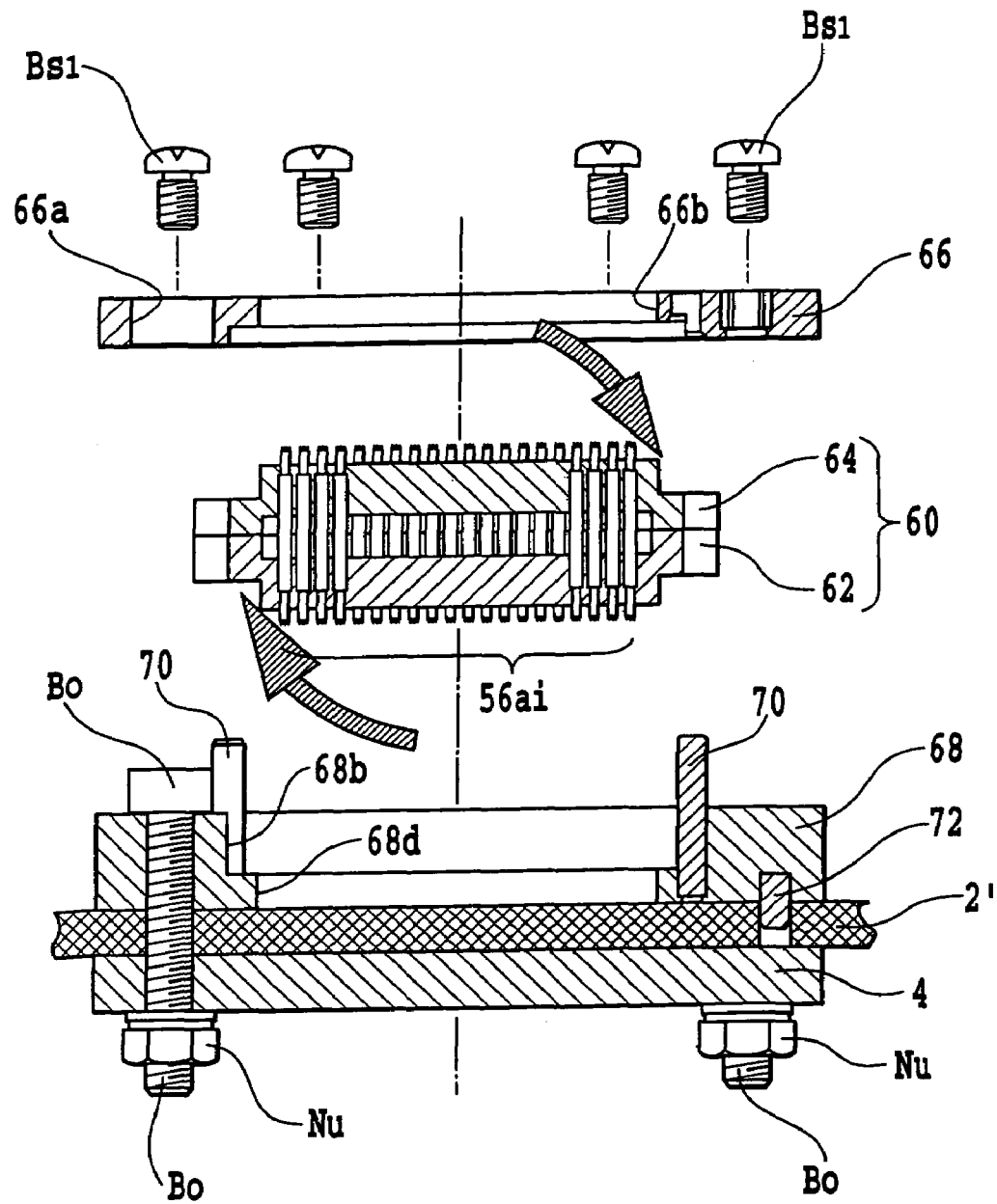
FIG. 24 is a sectional view made available for explaining the procedure for assembling the embodiment shown in FIG. 20.

As shown in FIGS. 23 and 24, the base 68 has a recess 68*a* for accommodating the probe pin cartridge 60, and an opening 68*d* communicating with the recess 68*b* at a center of the base 68. At four positions on the periphery of the recess 68*b*, apertures 68*a* are provided in correspondence with the apertures 66*a* of the cover member 66. On the bottom of the base member 68, a positioning pin 72 for the printed wiring board 2' is provided. One end of the positioning pin is engaged with a hole of the printed wiring board 2'.

Thereby, the base 68 is fixed to the printed wiring board 2' by inserting machine screws Bo into the aperture of the printed wiring board 2' and apertures of the reinforcement plate 4 disposed on the lower surface of the printed wiring board 2' and fastening to nuts Nu.

The probe pin cartridge 60 includes substrates 62 and 64 having the same structure to each other, and probe pins 56*ai* held by the substrates 62 and 64.

Since the substrates 62 and 64 have the same structure, the explanation will be made solely on the substrate 62 and that of the substrate 64 will be eliminated.

The outer circumference of the generally rectangular substrate 62 is engaged with the recess 68*a* of the base 68 and positioned to the printed wiring board 2'. At that time, the stepped portion of the substrate 64 is engaged with the recess 68*b*.

The substrate 62 has a through-hole group 62*ai* consisting of a plurality of through-holes through which pass contact sections 56*b* of the probe pins 56*ai* in an area having a predetermined width along the outer circumference of the stepped portion. At corners apart from the stepped portion of the substrate 62, apertures are provided, through which pass machine screws Bs2 for coupling the substrates 62 and 64 to each other. In this regard, in the substrate 64, female threads are formed in correspondence with these apertures of the substrate 62. On one surface of the substrate 62, a recess is formed as shown in FIG. 21. Accordingly, by coupling the recess in the substrate 62 with the recess in the substrate 64, an interior space is defined.

In such a structure, if the stable electric connection has not been obtainable in one of the contact sections 56*b* in the probe pin 56*ai*, for example, by the repeated contact thereof with the electrode section of the semiconductor device, such as a solder ball, due to the adhesion of solder to the contact section 56*b*, the probe pin cartridge 60 is once removed and the substrate 62 is reversed to be in contact with the printed wiring board 2' as shown in FIG. 24, and fixed again. Thereby, the contact section 56*b* free from the adhesion of solder in the substrate 64 can be brought into contact with the electrode sections of the semiconductor device during the test. Upon reversing, the solder or others adhered to the contact section 56*b* of the probe pin 56*ai* in the substrate 62 may be removed.

In this regard, while the probe pin cartridge is applied to a clam shell type socket in the above-mentioned embodiments, it is also applicable to the socket of other types in a detachable manner.

Figure 25:
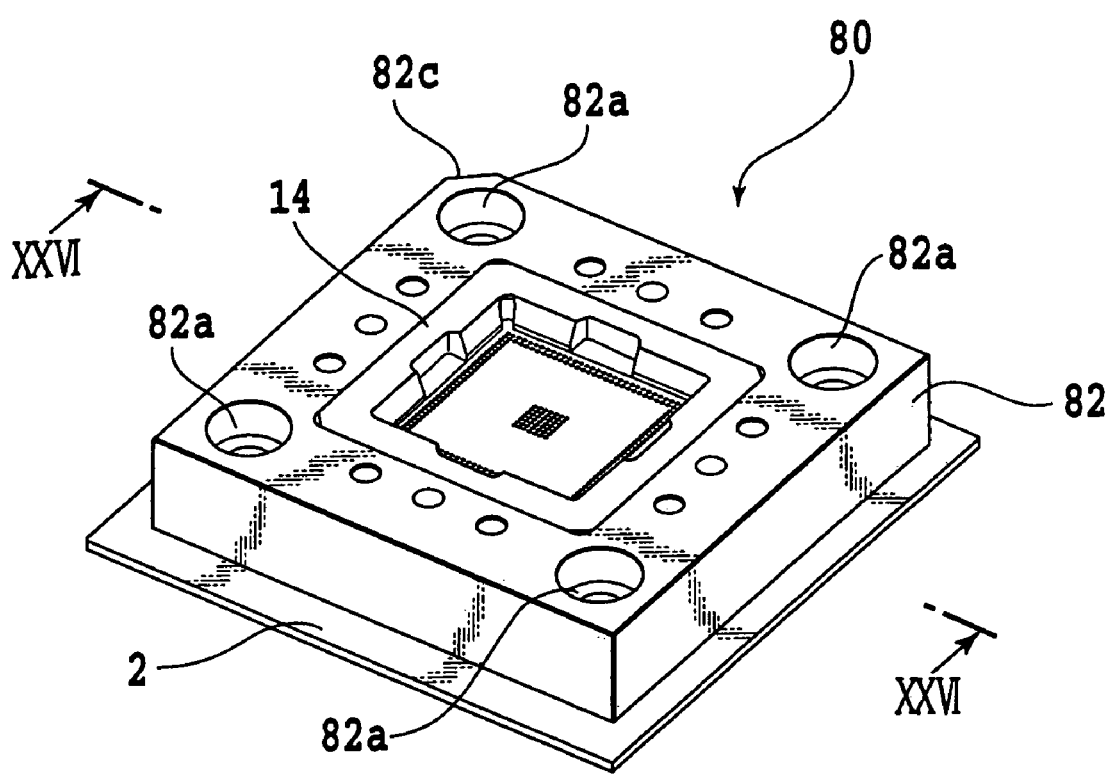
FIG. 25 illustrates a perspective view of an appearance of a sixth embodiment of a semiconductor device socket according to the present invention together with a printed wiring board.

FIG. 25 illustrates a sixth embodiment of a semiconductor device socket according to the present invention.

In the semiconductor device socket 10 of the first embodiment shown in FIGS. 1 and 2, the probe pins 22 having a total length of 5.7 mm are solely used. On the other hand, a semiconductor device socket 80 shown in FIG. 25 can use probe pins 22 having a total length 5.7 mm and probe pins 92 having a total length of 4.8 mm in a selectable manner.

In this regard, in FIGS. 25 and 26 to 42 described later, the same reference numerals are used for denoting the same elements as in the embodiment shown in FIGS. 1 and 2, and the redundant explanation thereof is eliminated.

A plurality of semiconductor device sockets 80 are arranged at positions on the printed wiring board 2 in correspondence with the respective conductive layers. In this regard, only one semiconductor device socket is illustrated as a representative in FIG. 25. The semiconductor device socket 80 is of a type corresponding, for example, to a handler of a conveyor robot (not shown) as a pressing mechanism. A semiconductor device DV tested while being held by the handler is attached to or detached from the semiconductor device socket 80. The semiconductor device DV is of BGA type or LGA type in a generally square shape, having an electrode surface on which a plurality of electrode sections are arranged in a matrix manner.

The semiconductor device socket 80 includes, as main elements thereof, a casing member 82 for accommodating a probe pin cartridge described later therein and forming an outer wall, a probe pin cartridge for holding a plurality of probe pins as a contact terminal group modified to be a module in accordance with shapes of the semiconductor device DV, and a movable type positioning member 14 for positioning electrode sections in the semiconductor device DV relative to the respective probe pins in the probe pin cartridge.

The casing member 82 molded of aluminum alloy is formed in a relatively thin-walled frame-like shape and has an opening 82H at a center thereof into which is inserted a frame-like wall of a positioning member 14. At four corners of the casing member 12, through-holes 82a are provided in the thickness direction thereof, for allowing fixing machine screws Bs to pass therethrough. The respective fixing machine screw Bs is inserted into attachment hole in the printed wiring board 2 via the through-hole 12a and fastened by a nut. Thereby, the casing member 82 is secured to the printed wiring board 2.

On the outer circumference of one of the four corners in the casing member 82, a chamfered portion 82c is formed as a mark. On the respective side of the peripheral edge of the opening 82H, a female thread portion 82t2 is formed to be threaded with a machine screw 26 for fixing the probe pin cartridge described later to the casing member 12. Also, on each of the opposite two sides of the peripheral edge of the opening 12H, a female thread portion 82t1 is formed to be threaded with a machine screw 20 for fixing one of a plurality of substrates forming the probe pin cartridge to the casing member 12. At four positions adjacent to the female threads 82t1 and 82t2, there are recesses 82r having a predetermined depth, into which inserted projections 87f described later.

An opening 82f having a shape corresponding to that of a substrate thereof is formed on the bottom of the casing member 82 so that the probe pin cartridge can be inserted into the interior of the casing member 82 through the bottom. The opening 82f communicates with the interior 82b thereof.

Between a substrate 86 of a probe pin cartridge described later and the respective flange 14F of the positioning member 14, there is a coil spring 18 for biasing the positioning member 14 toward the inner circumference of the casing member 82. The positioning member 14 is supported by the plurality of coil springs 18 to be movable in the attaching/detaching direction of the semiconductor device DV.

Figure 26:
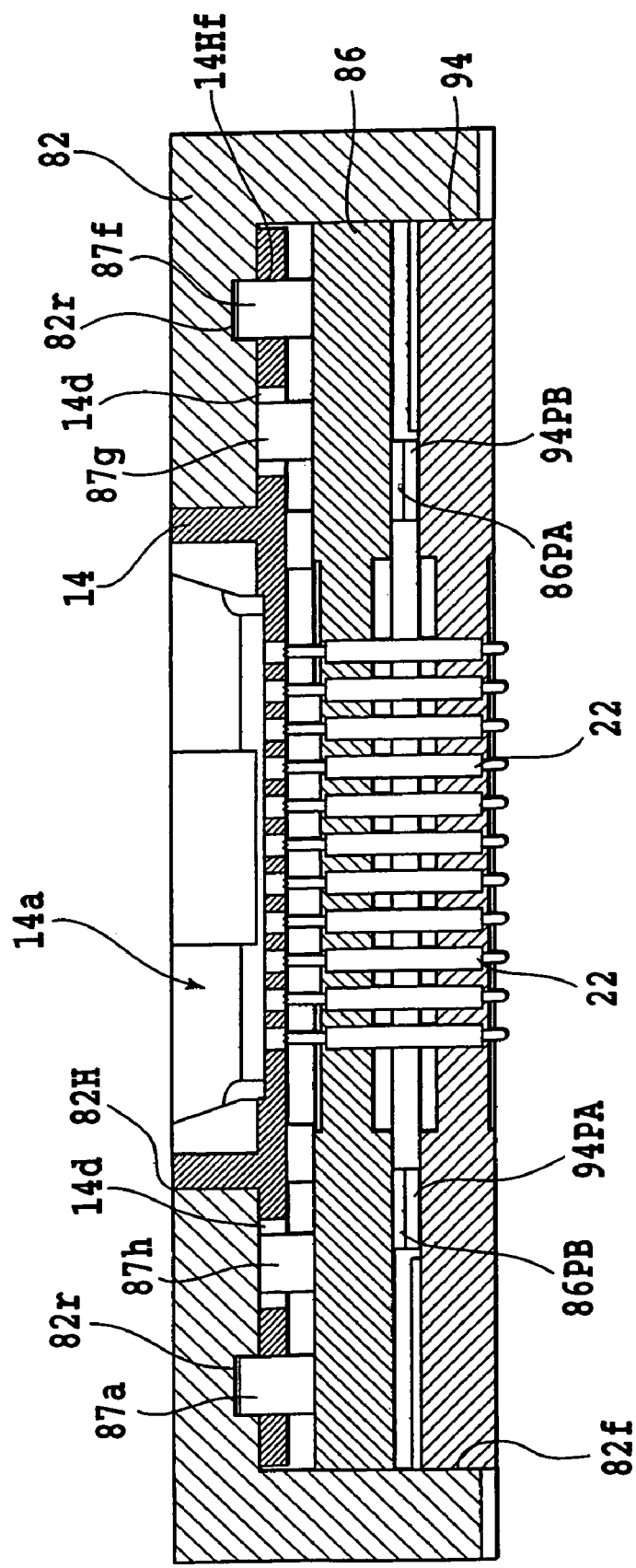
FIG. 26 is a sectional view taken along a line XXVI-XXVI in FIG. 25.

FIG. 26 illustrates a state wherein the probe pin cartridge is fixed as a contact terminal cartridge in an inner space 82b of the casing member 82.

Figure 27:
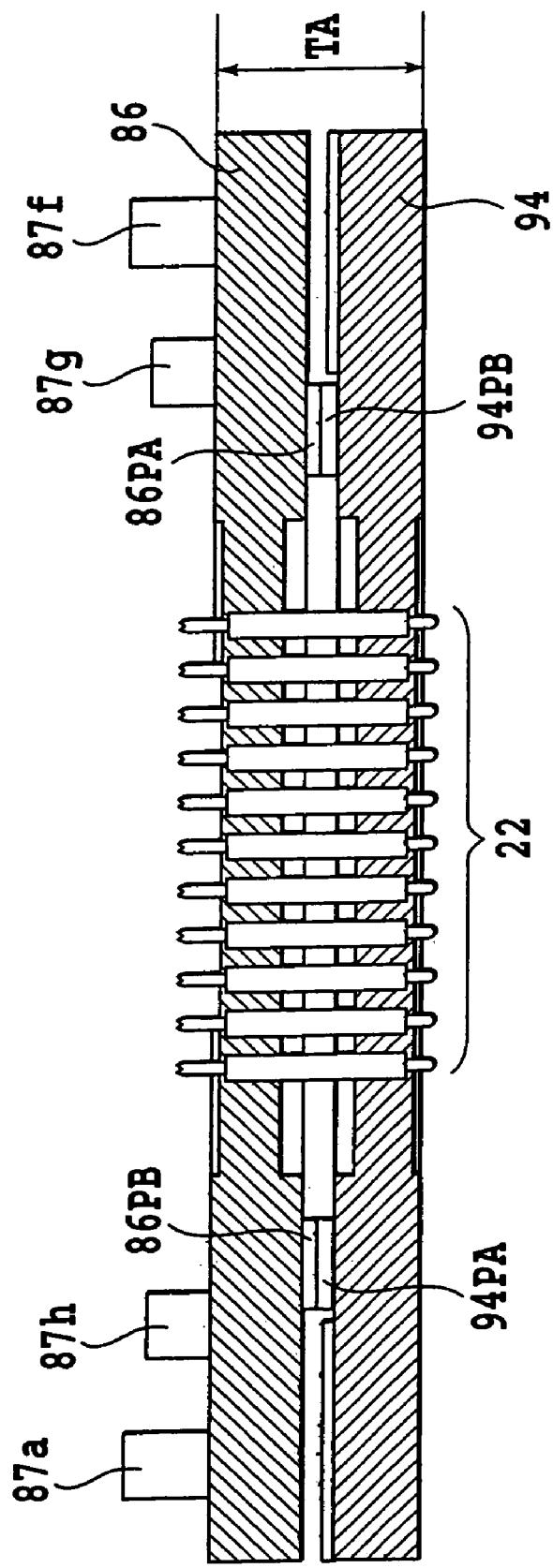
FIG. 27 is a sectional view showing a probe pin cartridge provided in the embodiment shown in FIG. 25.
Figure 28:
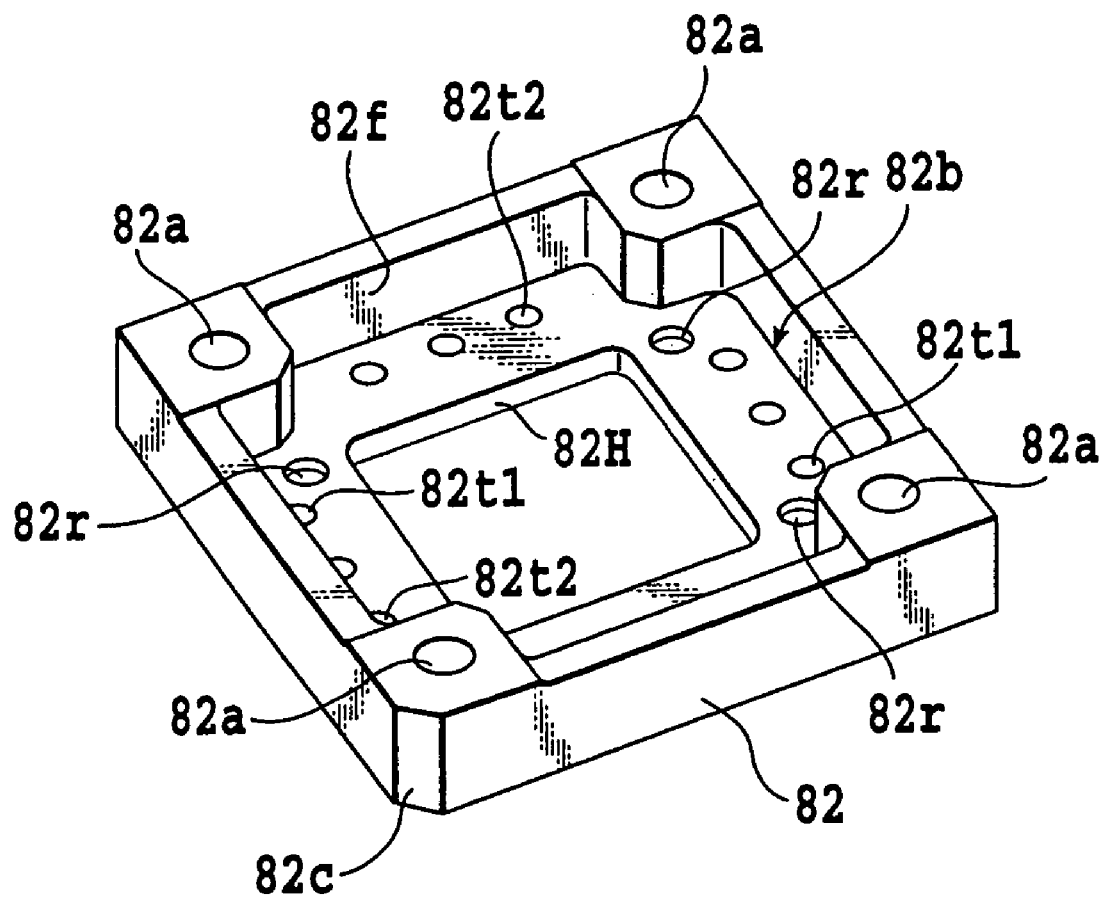
FIG. 28 is a perspective view showing a casing member in the embodiment of FIG. 25.
Figure 31:
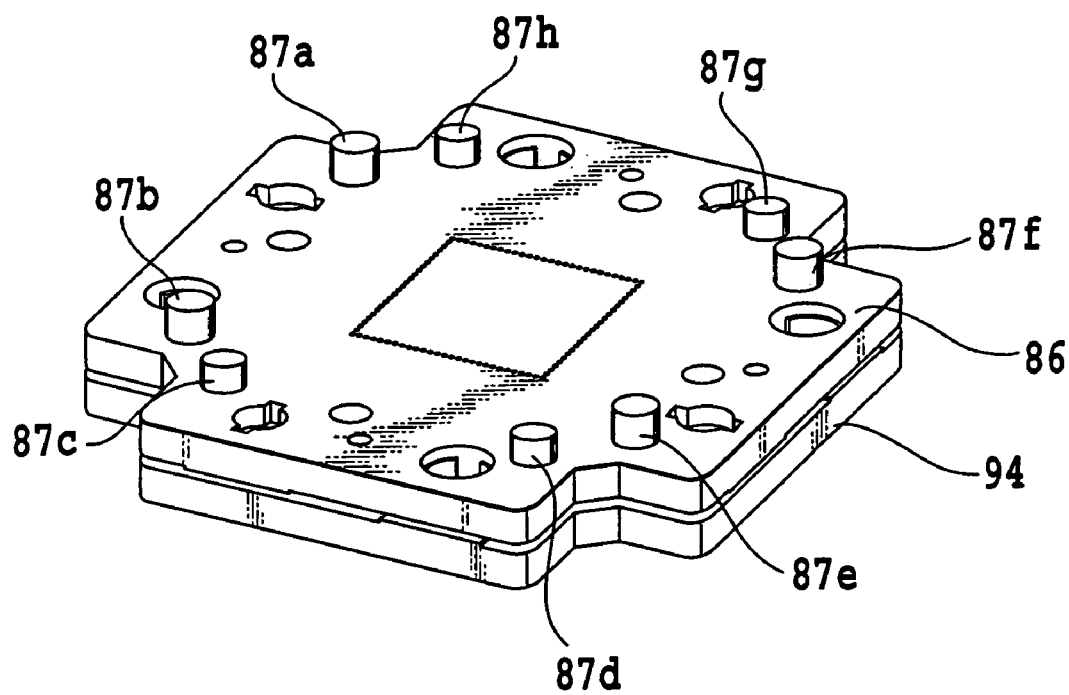
FIG. 31 is a perspective view of the probe pin cartridge shown in FIG. 27.

As shown in FIGS. 27 and 31, the probe pin cartridge includes as main components thereof a first substrate 86 disposed opposite to the positioning member 14, a second substrate 94 having the same contour as the substrate 86 and disposed directly beneath the substrate 86, and a plurality of probe pins 22 held by the substrates 86 and 94.

The probe pins 22 have a total length (a probe length) of 5.7 mm in the same manner as in the above-described first embodiment, and are located in correspondence with the arrangement of the electrode sections of the semiconductor device DV.

Figure 32A:
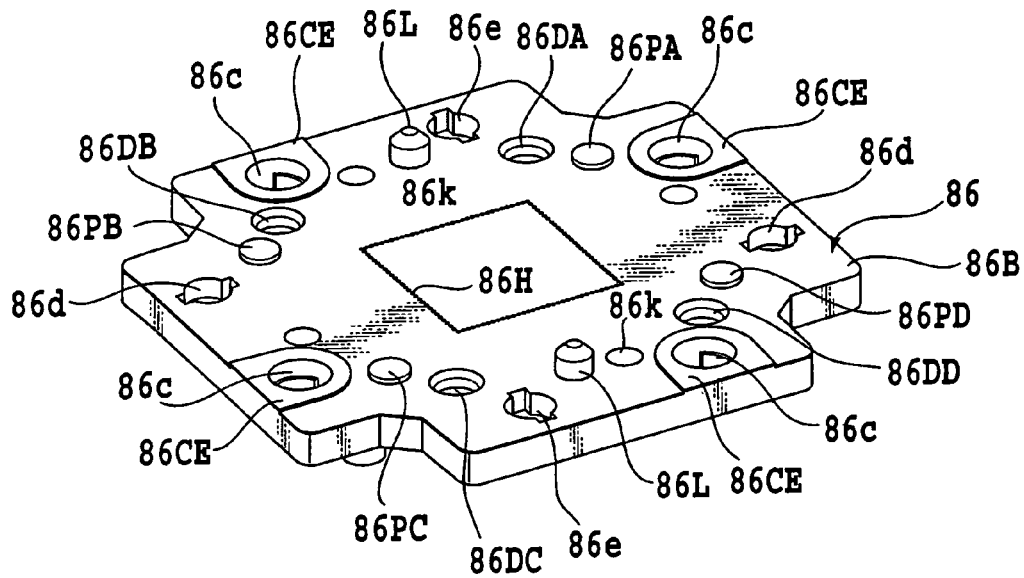
FIG. 32A is a perspective view showing a second surface of the second surface of the substrate shown in FIG. 29A.
Figure 32B:
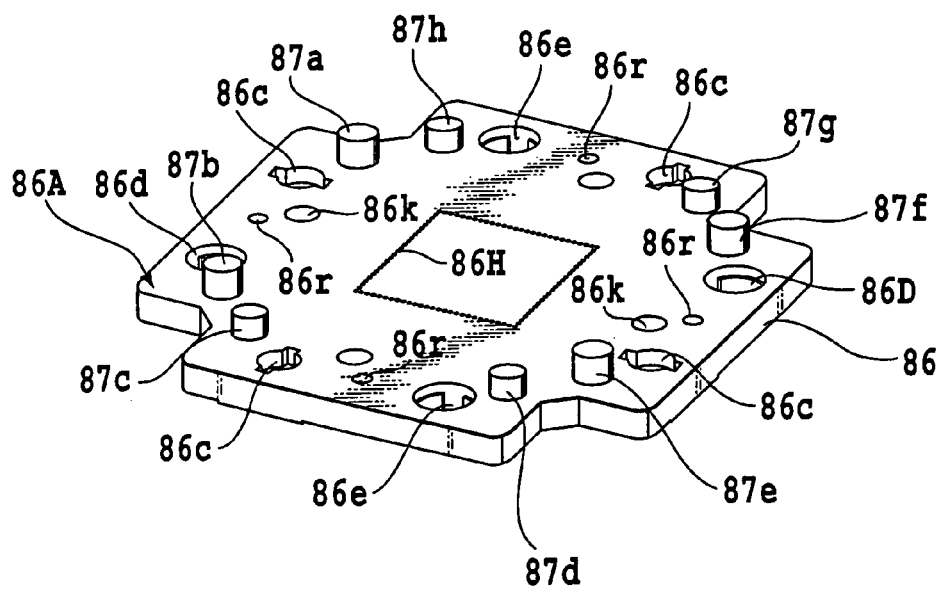
FIG. 32B is a perspective view showing a first surface of the substrate shown in FIG. 32A.

As shown in FIGS. 32A and 32B, the generally cross-shaped substrate 86 has first surface 86A and a second surface 86B opposite to each other.

The substrate 86 has, at a center thereof, a through-hole group 86H formed of a plurality of apertures through which pass the contact sections 22a of the probe pins 22. On the respective side of the substrate 86, an aperture 86c through which passes the machine screw 26 is formed. On a side opposite thereto, an aperture 86e through which passes the machine screw 20 is formed in correspondence with the aperture 14e in the positioning member 14 at a predetermined distance from the aperture 86c. Between the apertures 86c and 86e on the respective side, an aperture 86r through which passes one end of the coil spring 18 is formed.

On the other hand, on each of the remaining opposite sides, an aperture 86d through which passes the hook screw 28 is formed at a distance from the aperture 86c. On the inner circumference of the aperture 86d, a stepped portion selectively engageable with a T-shaped distal end of the hook screw 28 is formed in the circumferential direction. A slit through which passes the T-shaped distal end of the hook screw 28 is formed in the stepped portion. Between the apertures 86d and 86c on the respective side, an aperture 86r into which is inserted one end of the coil spring 18 is formed. At a position adjacent to the aperture 86r, there is an aperture 86k into which is inserted a pin 94LB described later.

On the respective sides of the first surface 86A described above, projections 87a, 87b, 87c, 87d, 87e, 87f, 87g and 87h are provided in correspondence to the above-mentioned holes 14Ha, 14Hb, 14Hc, 14Hd, 14He, 14Hf, 14Hg and 14Hh (see FIG. 2), respectively. A projected height of the projections 87a, 87b, 87e and 87f is slightly higher than that of the projections 87c, 87d, 87g and 87h as shown in FIG. 27. Also, tip ends of the projections 87c, 87d, 87g and 87h are inserted into the above-mentioned recess 82r via the respective apertures in the positioning member 14. On the other hand, tip ends of the projections 87c, 87d, 87g and 87h are brought into contact with the inner circumference of an upper portion of the casing member 82 via the respective apertures in the positioning member 14. Accordingly, the respective projections 87a to 87h are used for the relative positioning of the positioning member 14 to the substrates 86 and 94 in the thickness direction.

Figure 29A:
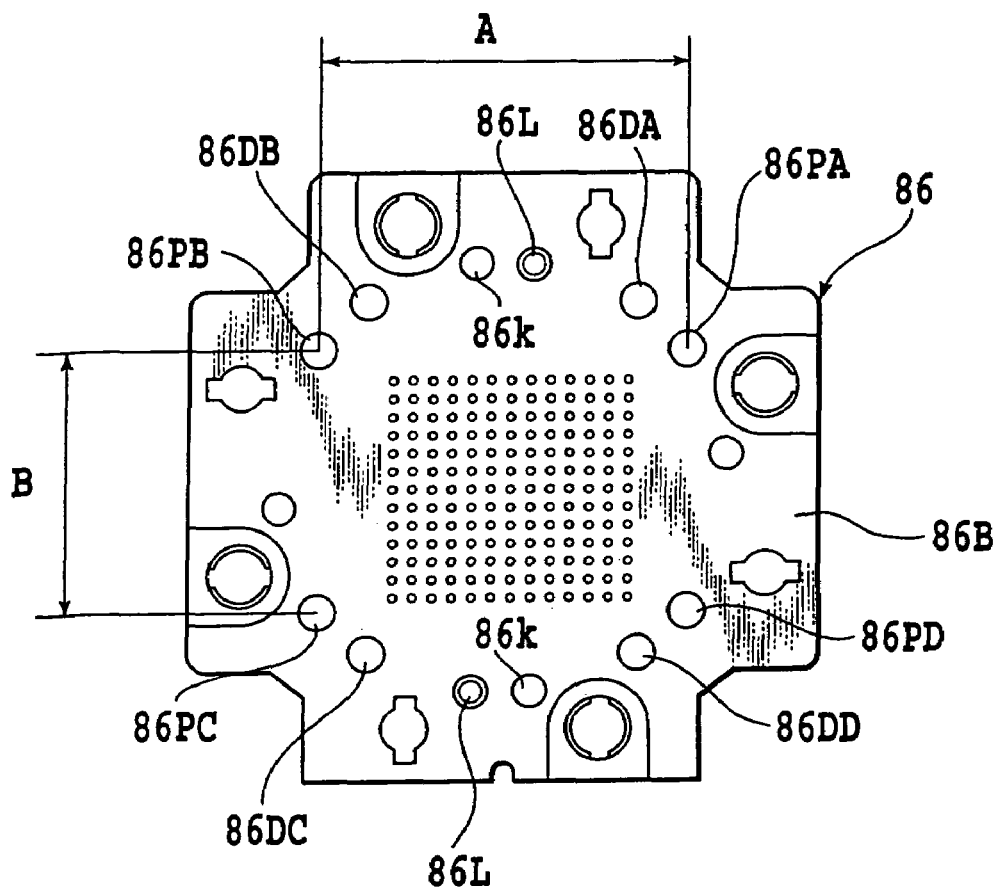
FIG. 29A is a plan view showing a second surface of one substrate constituting part of the probe pin cartridge shown in FIG. 27.
Figure 29B:
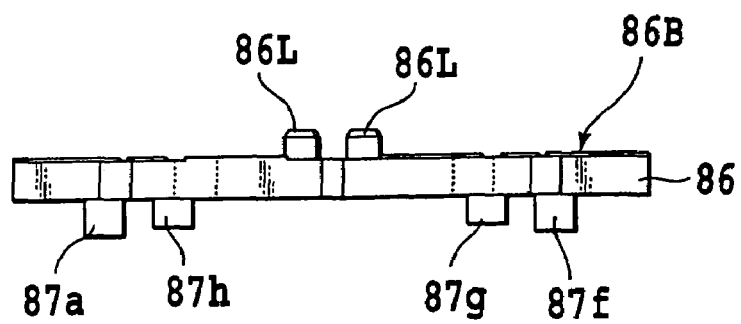
FIG. 29B is a side view of FIG. 29A.
Figure 36A:
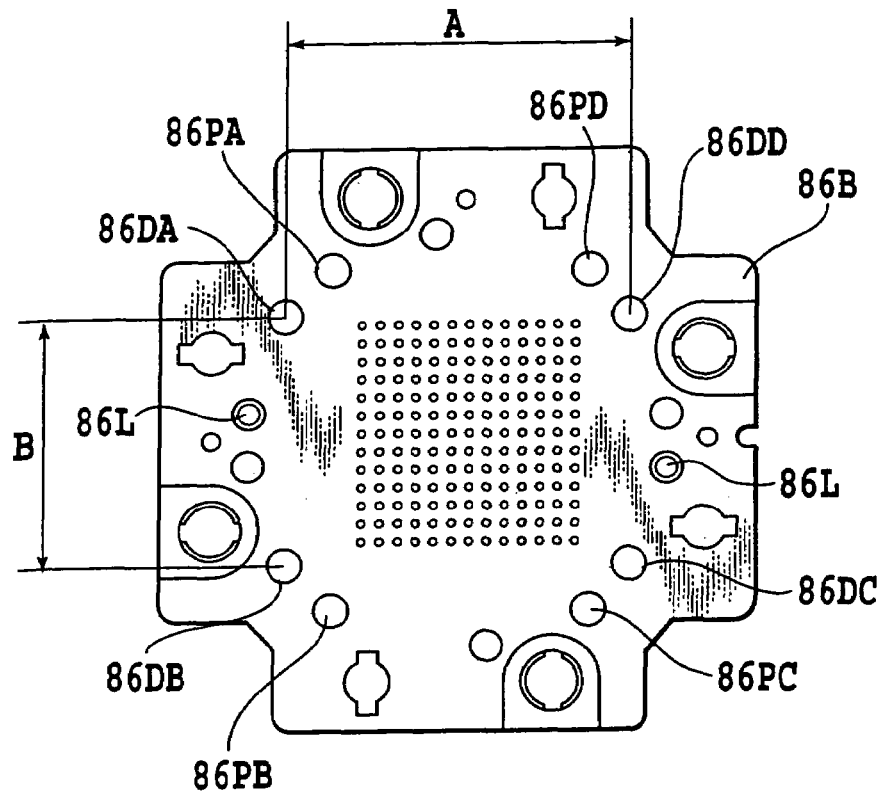
FIG. 36A is a plan view illustrating the arrangement of a second surface of one substrate constituting part of the probe pin cartridge shown in FIG. 34.
Figure 36B:
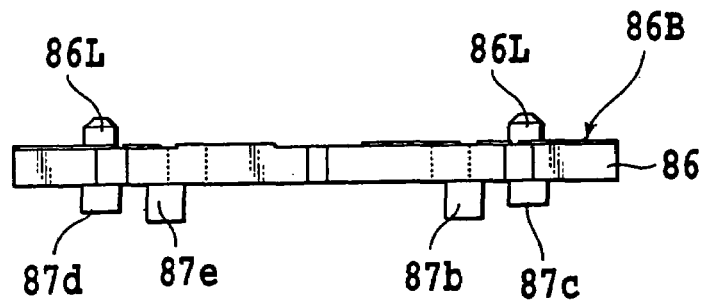
FIG. 36B is a side view of FIG. 36A.
Figure 37A:
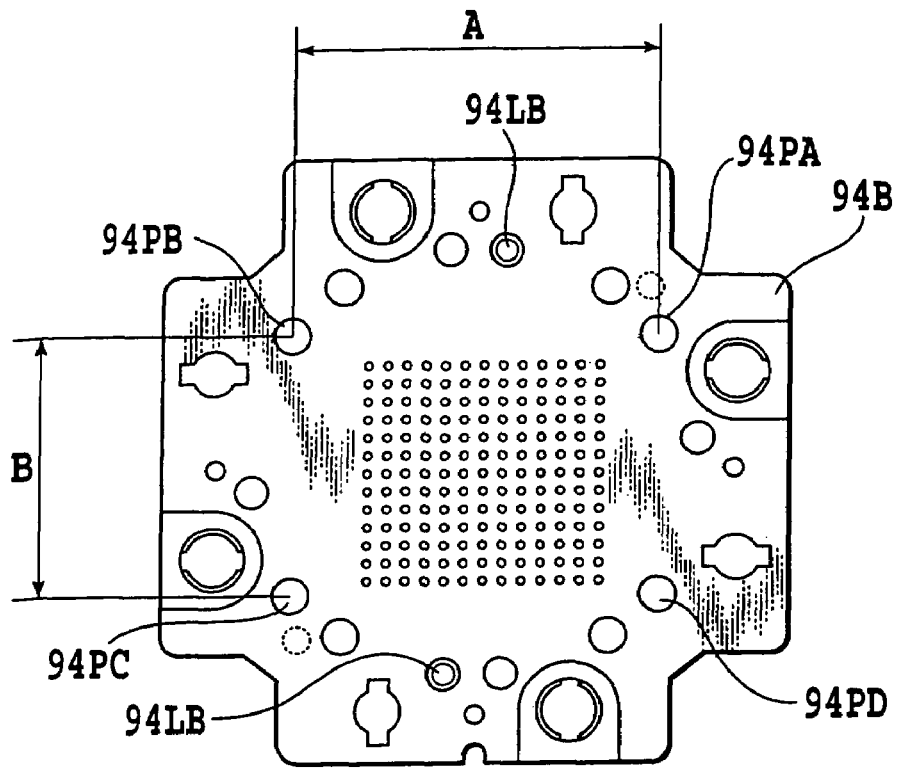
FIG. 37A is a plan view illustrating the arrangement of a second surface of the other substrate constituting part of the probe pin cartridge shown in FIG. 34.
Figure 37B:
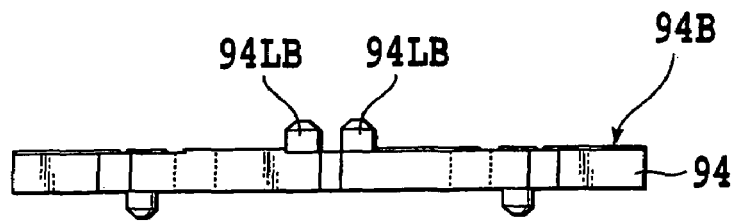
FIG. 37B is a side view of FIG. 37A.

On the other hand, as shown in FIG. 32A, one opening end of the above-mentioned aperture 86c is formed on the second surface 86B. A shape of the one opening end of the aperture 86c is different from a shape of the other opening end of the aperture 86c. On the periphery of the one opening of the respective aperture 86c, a seating face 86CE is formed. One opening end of the aperture 86e is formed adjacent to the respective aperture 86c. A shape of the one opening end of the aperture 86e is different from a shape of the other opening end of the aperture 86e. Further, the other opening end of the aperture 86d is formed adjacent to the aperture 86c. A shape of the one opening end of the aperture 86d is different from a shape of the other opening end of the aperture 86d. On the respective sides on which the apertures 86e are formed, pins 86L are provided adjacent to the respective apertures 86k while being obliquely opposed to each other as shown in FIGS. 29A and 29B. At positions on both sides of the respective pins 86L and the apertures 86k, indents 86DA, 86DB, 86DC and 86DD are provided. As shown in FIG. 36A, a distance A between the indents 86DA and 86DD is larger than a distance B between the indents 86DA and 86DB.

Figure 34:
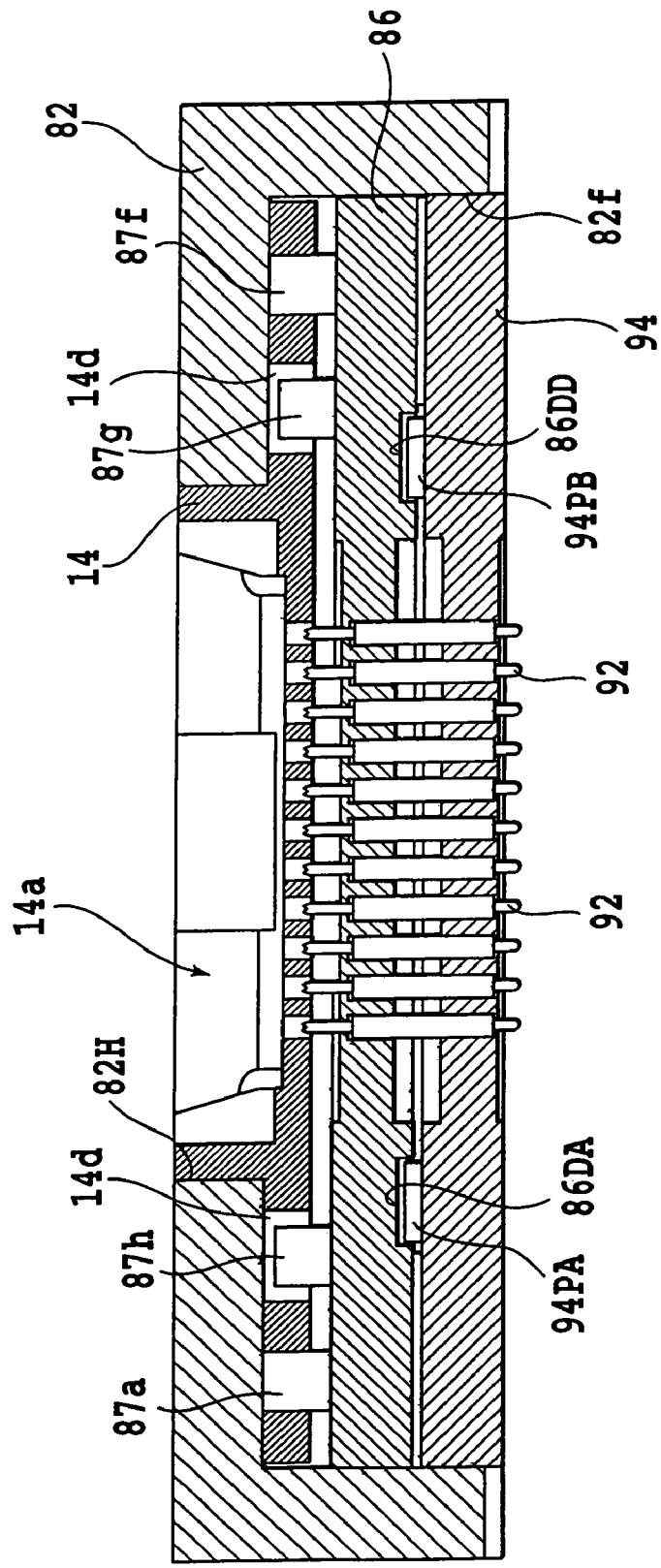
FIG. 34 is a sectional view of the embodiment shown in FIG. 25 taken along a line XXVI-XXVI when a probe pin cartridge different from that shown in FIG. 27 is mounted.

As described later, when probe pins 92 are used, protrusions 94PA, 94PB, 94PC and 94PD in the substrate 94 are inserted into the indents 86DA, 86DB, 86DC and 86DD as shown in FIG. 34.

On a side on which are provided the apertures 86d, protrusions 86PA, 86PB, 86PC and 86PD are formed adjacent to the indents 86DA to 86DD, respectively. As shown in FIG. 29A, a distance A between the protrusions 86PA and 86PB is larger than a distance B between the protrusions 86PB and 86PC.

The respective protrusions 86PA and 86PB are brought into contact with the protrusions 94PB and 94PA in a substrate 94 described later.

Figure 33A:
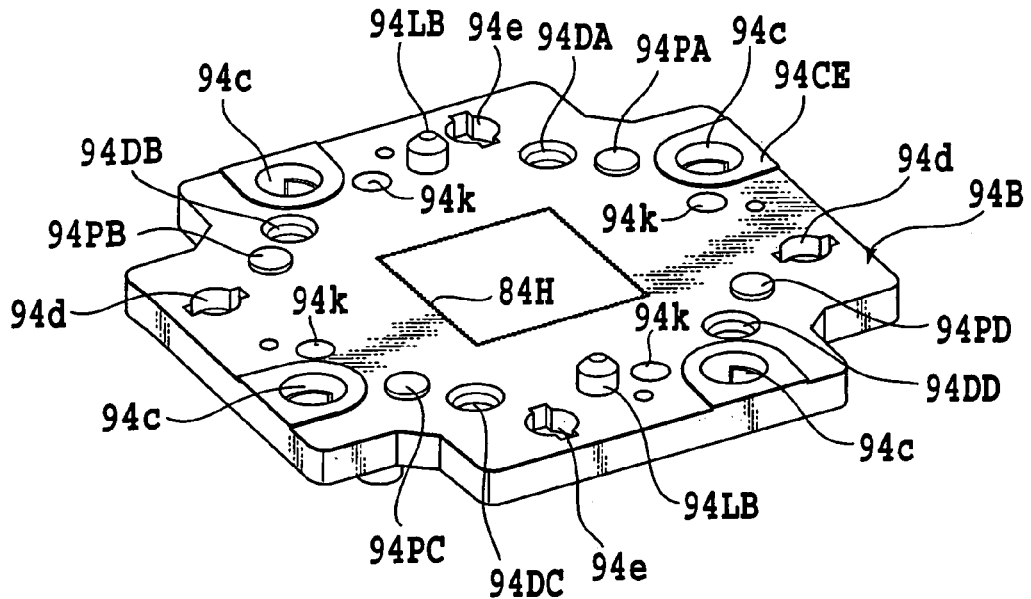
FIG. 33A is a perspective view showing a second surface of the substrate shown in FIG. 30A.
Figure 33B:
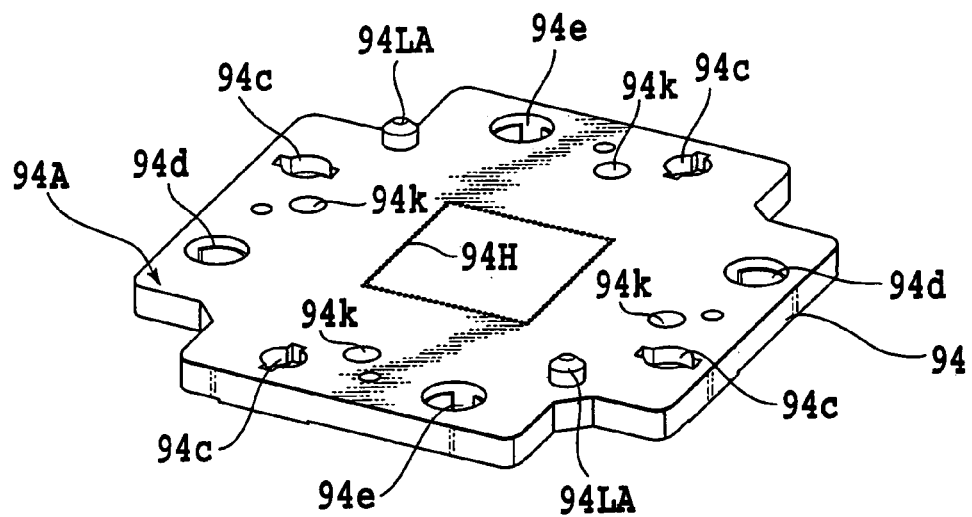
FIG. 33B is a perspective view showing a first surface of the substrate shown in FIG. 33A.

The generally cross-shaped substrate has a first surface 94A and a second surface 94B opposite to the first surface 94A as shown in FIGS. 33A and 33B.

The substrate 94 is provided at a center thereof with a through-hole group 94H consisting of a plurality of apertures through which pass the probe pins 22. On the respective side of the substrate 94, there is an aperture 94c through which passes a machine screw 26. Also, on a side opposite to this side, an aperture 94e from which exposes a head of a machine screw 20 is formed at a position apart by a predetermined distance from the aperture 94c. An aperture 94k into which is inserted a pin 86L is formed between the apertures 94c and 94e on the respective side.

On each of the remaining sides opposite to each other, an aperture 94d through which passes a hook screw 28 is provided apart at a distance from the aperture 94c. Between the apertures 94d and 94c, an aperture 94k into which is inserted a pin 86L is formed. On the first surface 94A, there are a pair of positioning pins 94LA opposite to each other.

On the other hand, on the second surface 94B, as shown in FIG. 33A, the other opening ends of the respective apertures 94c are formed. The other opening end of the aperture 94c has a shape different from that of the one opening end of the aperture 94c. On the periphery of the other opening end of the respective aperture 94c, a seating face 94CE is formed. The other opening end of the aperture 94e is formed adjacent to the respective aperture 94c. A shape of the other opening end of the aperture 94e is different from that of the one opening end of the aperture 95e. Further, the other opening end of the aperture 94d is formed adjacent to the respective aperture 94c. A shape of the other opening end of the aperture 94d is different from that of the one opening end of the aperture 95d. On the respective sides on which the apertures 94e are formed, pins 94L are provided adjacent to the apertures 94k while being obliquely opposed to each other while being obliquely inclined as shown in FIGS. 33A and 33B. At positions on both sides of the respective pins 94L and the apertures 94k, indents 94DA, 94DB, 94DC and 94DD are provided. The indents 94DA to 94DD are provided at four positions which are on a common circumference.

Figure 30A:
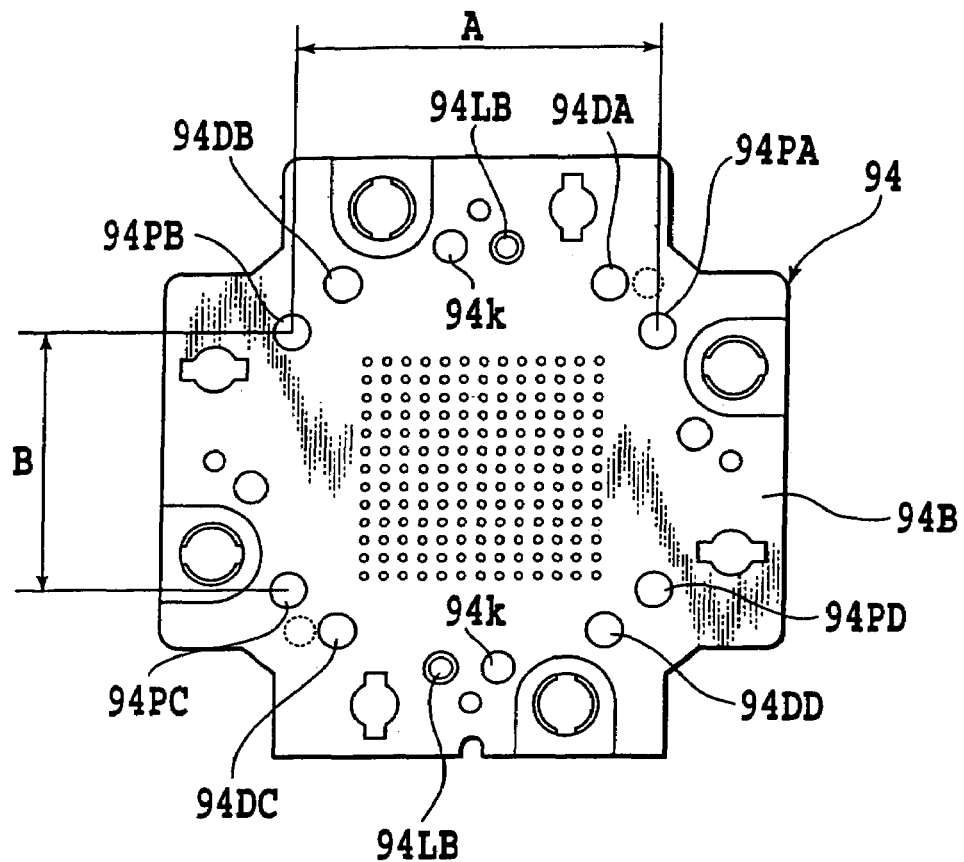
FIG. 30A is a plan view showing a second surface of another substrate constituting part of the probe pin cartridge shown in FIG. 27.
Figure 30B:
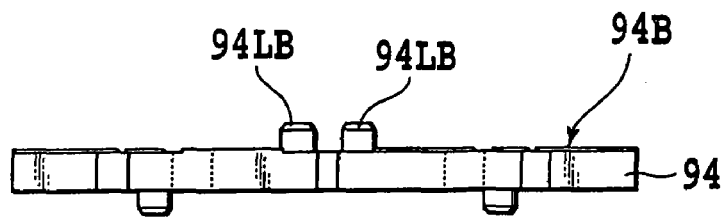
FIG. 30B is a side view of FIG. 30A.

On a side on which are provided the apertures 94d, protrusions 94PA, 94PB, 94PC and 94PD are formed at four positions which are on a common circumference, adjacent to the indents 94DA to 94DD, respectively. As shown in FIG. 30A, a distance A between the protrusions 94PA and 94PB is larger than a distance B between the protrusions 94PB and 94PC. The distance A between the protrusions 94PA and 94PB is equal to the distance A between the protrusions 86PA and 86PB of the substrate 86. In addition, the distance B between the protrusions 94PB and 94PC is equal to the distance B between the protrusions 86PB and 86PC of the substrate 86. Accordingly, the respective protrusions 94PA and 94PB are brought into contact with the protrusions 86PB and 86PA in a substrate 86 described above.

The hook screw 28 having a T-shaped tip end is used for the coupling/releasing of the substrates 86 and 94. When the T-shaped section is engaged with a stepped portion of the aperture 86d in the substrate 86 via the aperture 94d, the substrates 86 and 94 are coupled together. On the other hand, when the hook screw 28 is in a slit of the stepped portion or it is removed, the substrates 86 and 94 are released from each other. In this regard, since the hook screw 28 is used for coupling the substrates 86 and 94 together when the probe pin cartridge is conveyed as a single part or soled alone in the market, it is removed as described later when the probe pin cartridge is disposed on the printed wiring board 2.

Accordingly, the exchangeable probe pin cartridge does not increase a size of the IC socket and can be simply assembled into the casing member 82.

Also, since the substrates 86 and 94 have the same contour, they are easily manufactured, particularly, resin-molded in accordance with a maximum number of the electrodes in the semiconductor device to be mounted thereon, whereby a part having the stable accuracy can be produced in a short period at a low cost.

Figure 35:
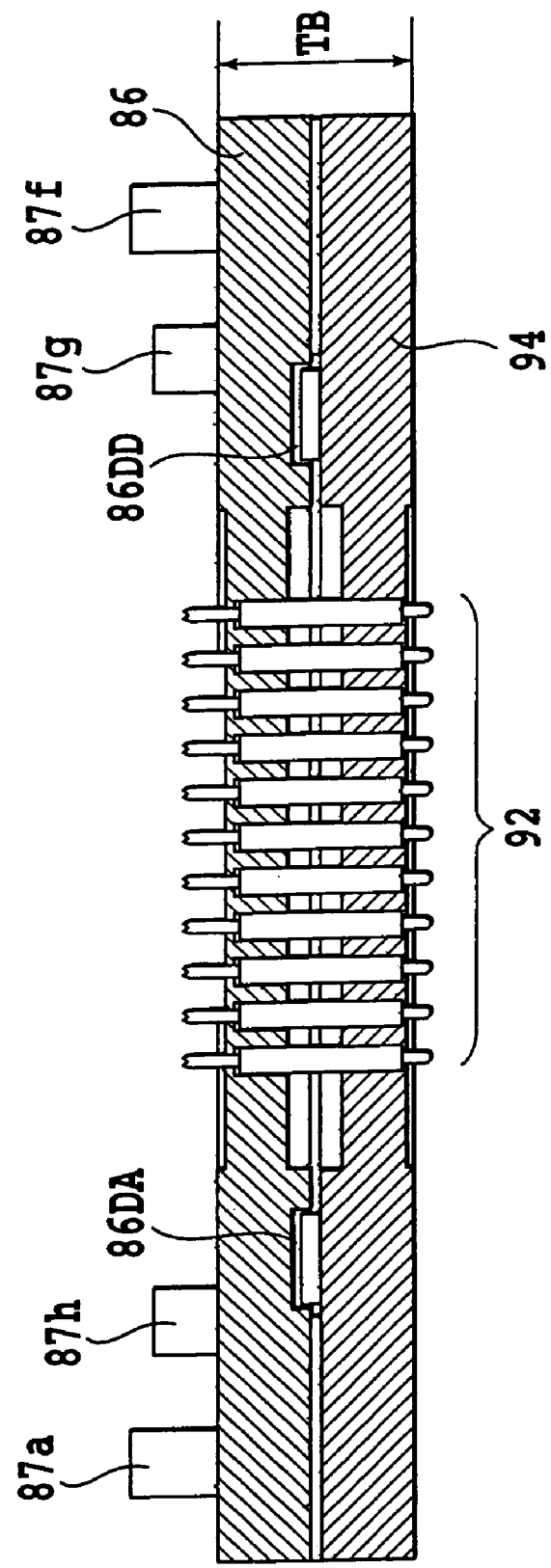
FIG. 35 is a sectional view of the probe pin cartridge provided in the embodiment shown in FIG. 34.

In such a structure, when the probe pins 22 in the semiconductor device socket 80 are replaced with fresh probe pins 92 as shown in FIGS. 34 and 35, the replacement operation is carried out in the following steps. A total length (a probe length) of the probe pin 92 is, for example, 4.8 mm which is shorter than a total length of the probe pin 22.

In this regard, FIG. 35 illustrates a state wherein a plurality of probe pins 92 are held by a probe pin cartridge consisting of the substrates 86 and 94, and FIG. 34 illustrates a state wherein this probe pin cartridge is accommodated in the interior space 82b.

Figure 38:
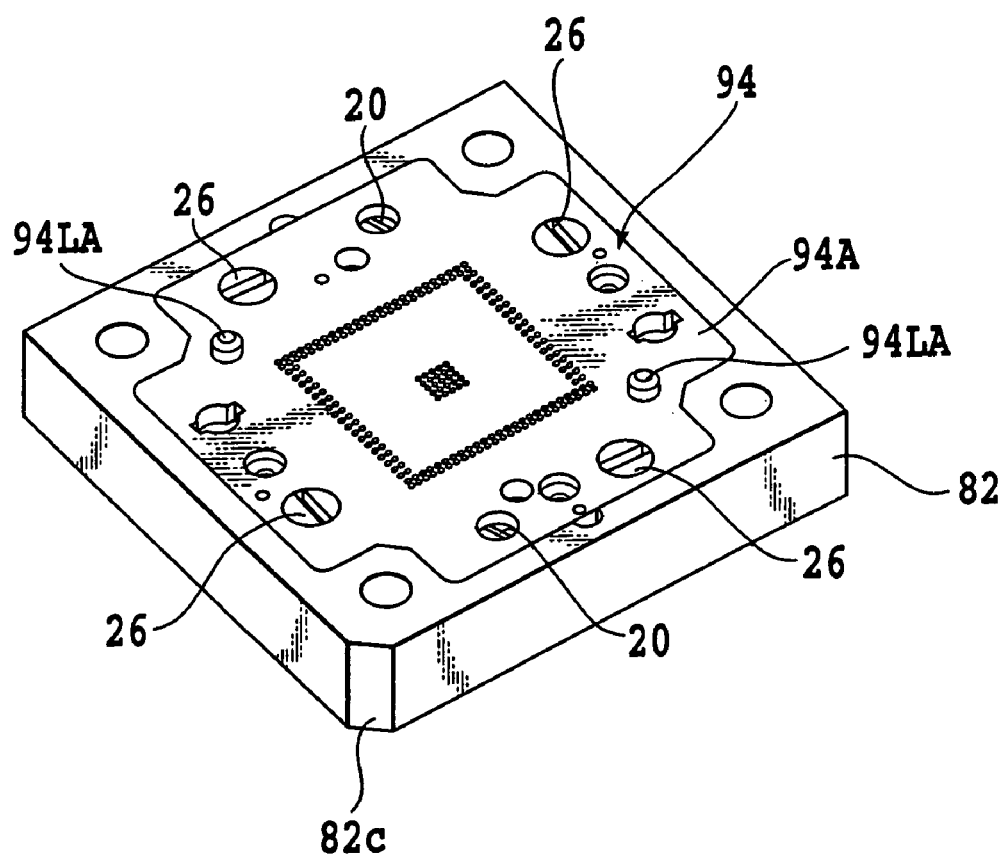
FIG. 38 is a perspective view of the embodiment shown in FIG. 25 as shown from the reverse.
Figure 39:
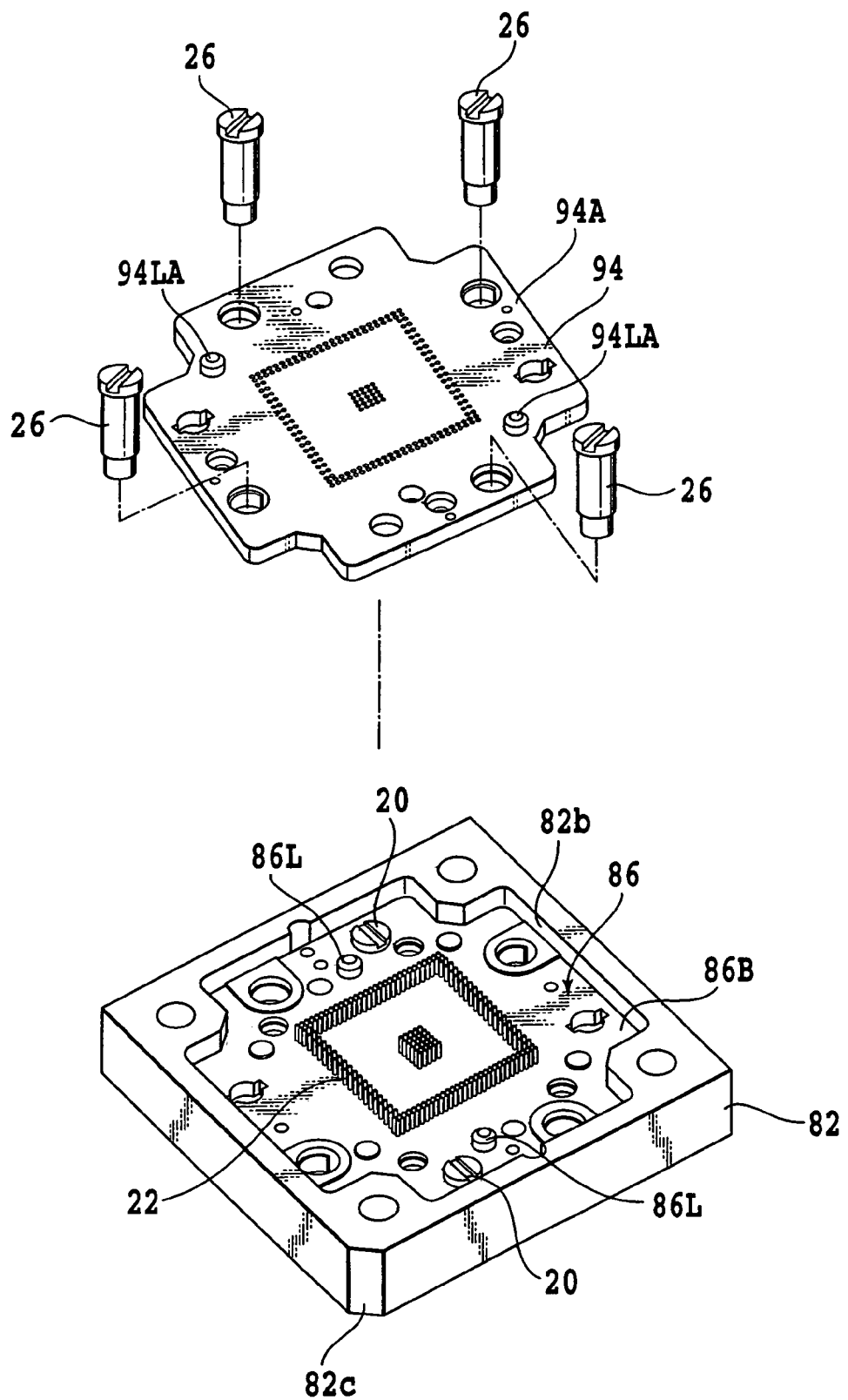
FIG. 39 is an exploded perspective view made available for explaining the procedure for assembling the embodiment shown in FIG. 25.

First, after the semiconductor device socket 80 is removed from the printed wiring board 2, it is reversed so that the first surface 94A of the substrate 94 of the probe pin cartridge 94 is visible as shown in FIG. 38. Then, as shown in FIG. 39, four machine screws 26 are removed. Thereby, the substrate 94 is separable from the substrate 86 and the casing member 82 as shown in FIG. 39.

Figure 40:
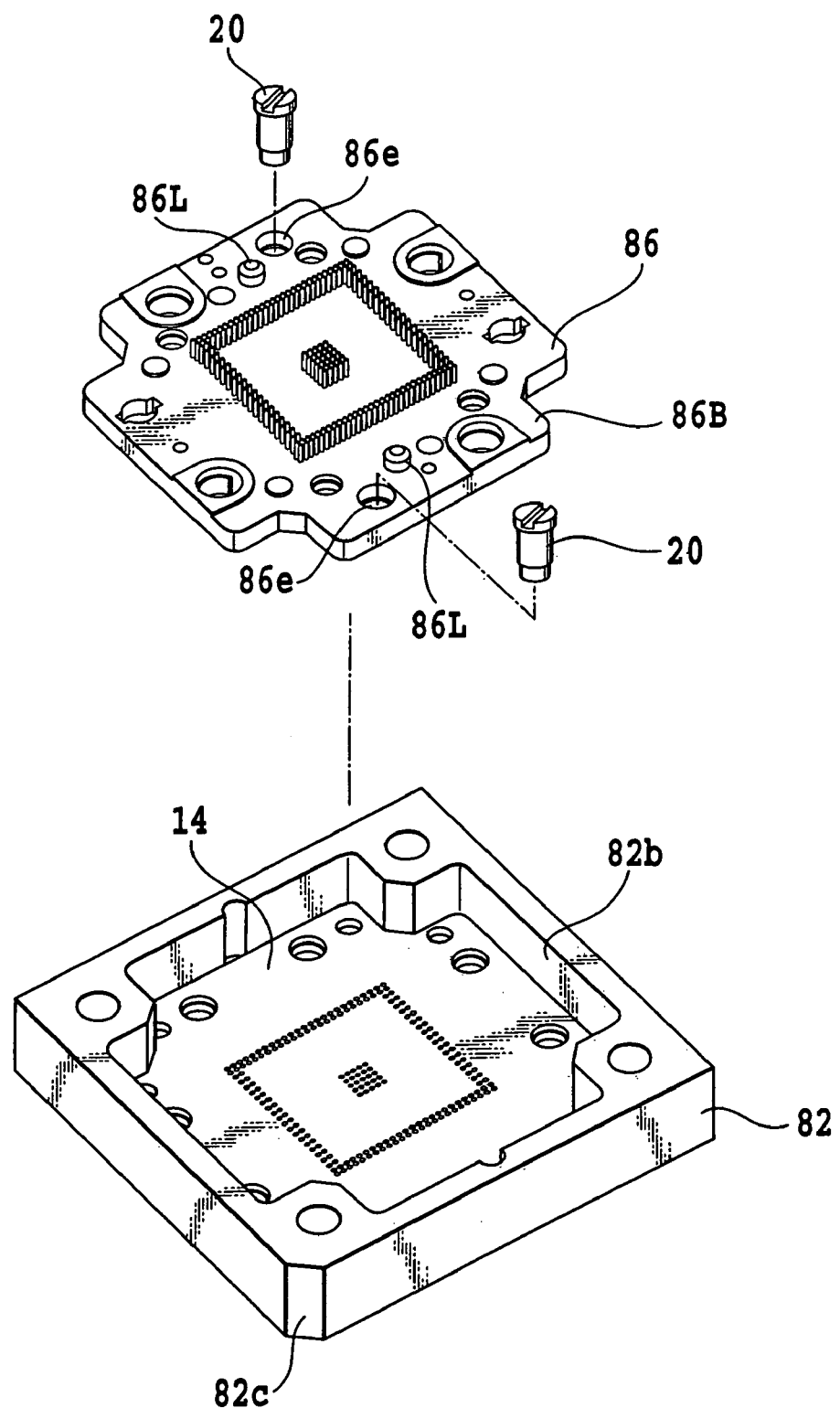
FIG. 40 is an exploded perspective view made available for explaining the procedure for assembling the embodiment shown in FIG. 25.
Figure 41A:
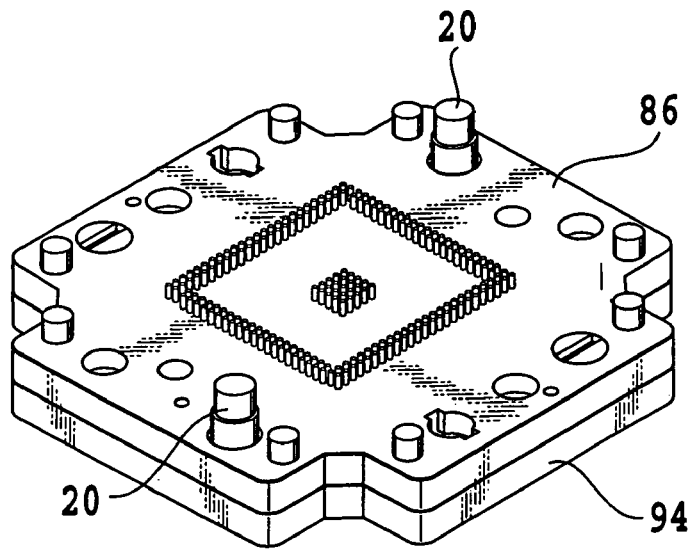
FIGS. 41A and 41B are exploded perspective views, respectively, made available for explaining the procedure for assembling the embodiment shown in FIG. 25.
Figure 41B:
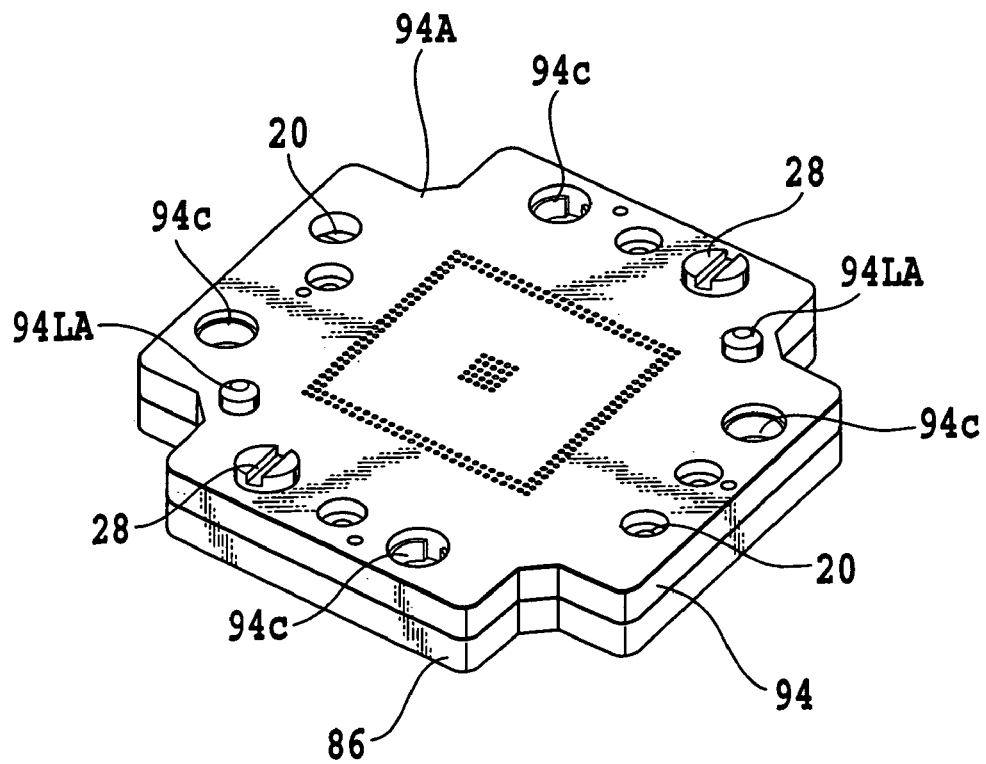

As shown in FIG. 40, two machine screws 20 are unfastened. Thereby, when the semiconductor device socket 80 is reversed again to resume the initial state, the probe pin cartridge provided with the probe pins 22 is separable as a whole from the casing member 82, and removed as shown in FIGS. 41A and 41B.

Then, the probe pin cartridge having the probe pins 92 are prepared. This probe pin cartridge is prepared by initially mounting the probe pins 92 onto the substrate 94 and then the substrate 94 is laid onto the substrate 86 so that the protrusions 94PA, 94PB, 94PC and 94PD of the substrate 94 are inserted into the indents 86DA, 86DD, 86DB of the substrate 86. That is, as shown in FIG. 36A, the substrate 86 is laid on the substrate 94 at a position rotating counterclockwise by 90° from a state shown in FIG. 29A. Thereby, a total thickness TB of the substrates 86 and 94 is smaller than a total thickness TA (see FIG. 27) in a case when holding the probe pins 22.

More specifically, a combination of the protrusions of the substrate 86 and the protrusions of the substrate 94 or a combination of the indents of the substrate 86 and the protrusions of the substrate 94 is changed based upon the above-described relationship between the distance A between the indents 86DA and 86DD and the distance B between the indents 86DA and 86DB, and the relationship between the distance A between the protrusions 94PA and 94PB and the distance B between the protrusions 94PB and 94PC, whereby the total thickness of the substrates 86 and 94 is made variable. In this regard, in order to satisfactorily maintain a flatness of the combined substrates 86 and 94, it is preferable that the indents or the protrusions are provided at four positions which are on a common circumference.

At this time, two hook screws 28 are mounted. Accordingly, the probe pin cartridge having the probe pins 92 is manufactured by using the common substrate 86 and 94.

The probe pin cartridge having the probe pins 92 is fixed to the casing member 82 in the same procedure as manufacturing the probe pin cartridge having the probe pins 22 described before.

That is, after the removed coil springs 18 are inserted into the apertures 86r of the fresh probe pin cartridge, that probe pin cartridge is assemble to the casing member 82 together with the positioning member 14.

Figure 42:
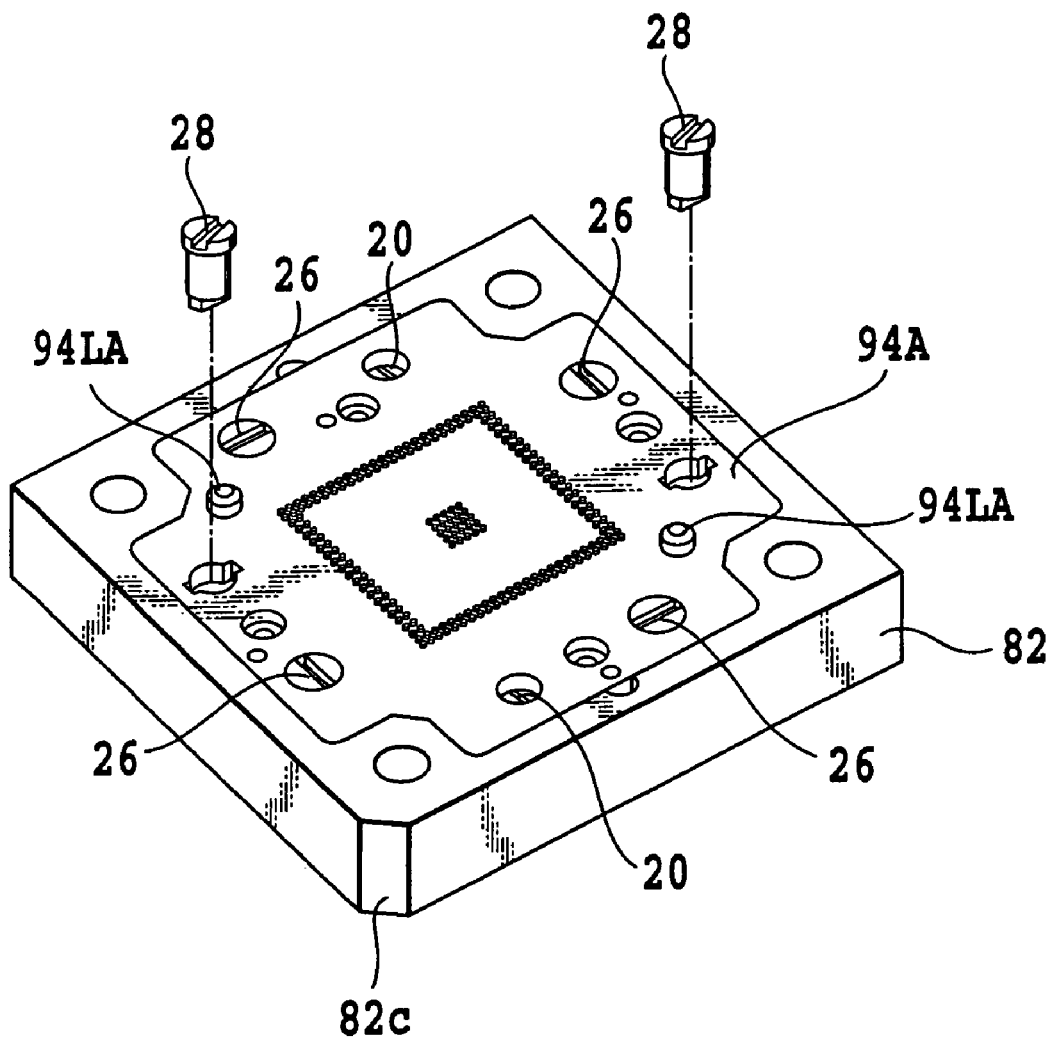
FIG. 42 is an exploded perspective view made available for explaining the procedure for assembling the embodiment shown in FIG. 25.

Then, the casing member 82 assembled with the probe pin cartridge and the positioning member 14 is reversed as shown in FIG. 42, after which the machine screws 20 and 26 are screw-engaged with the female threads of the casing member 82. Thereby, the replacement to the probe pin cartridge having the probe pins 92 has been completed.

Thus, it is possible to easily and quickly carry out the replacement of the probe pins or the probe pin cartridge as a whole.

Figure 43A:
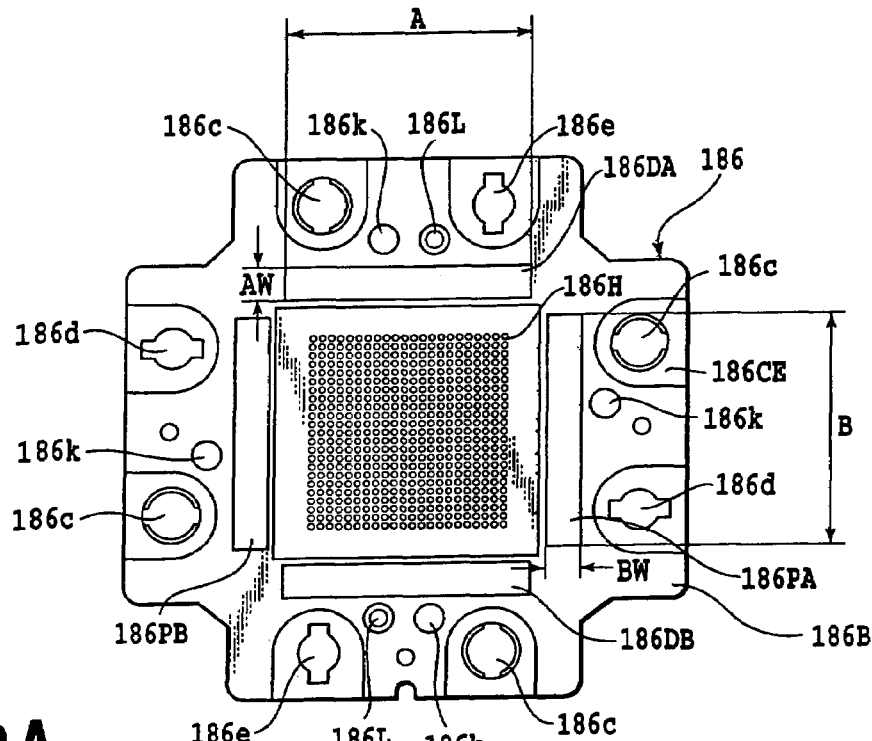
FIG. 43A is a plan view illustrating another example of the arrangement of a second surface of one substrate constituting part of the probe pin cartridge.
Figure 43B:
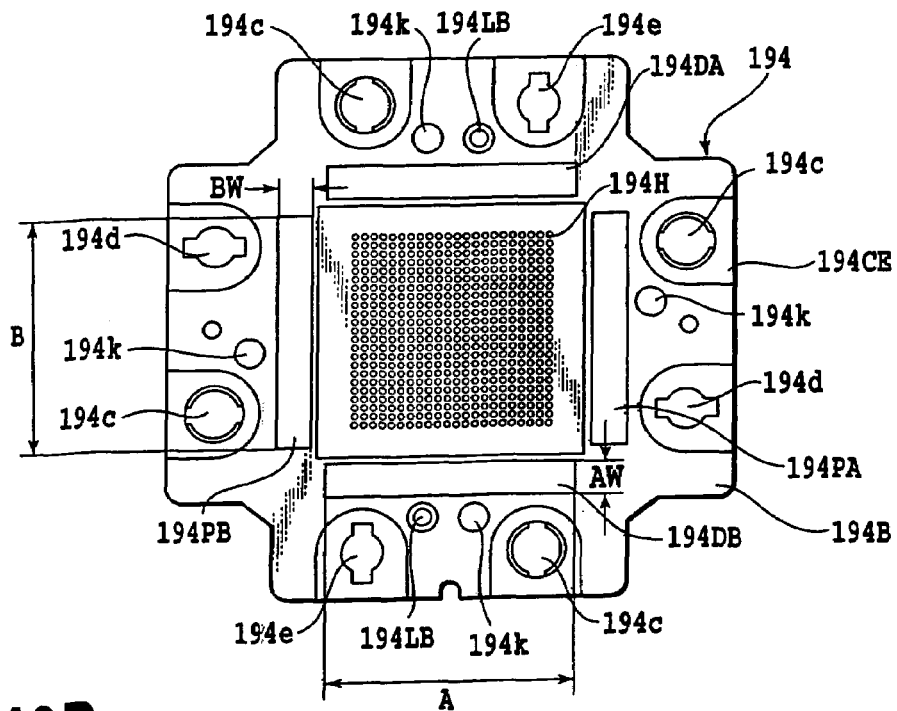
FIG. 43B is a plan view illustrating another example of the arrangement of a second surface of the other substrate constituting part of the probe pin cartridge.

Further, in the sixth embodiment described above, the indents 86DA to 86DD and the protrusions 86PA to 86PD are provided at two sets of four positions which are on common circumferences on the second surface 86B of the substrate 86, respectively, and the indents 94DA to 94DD and the protrusions 94PA to 94PD are provided at two sets of four positions which are on common circumferences on the second surface 94B of the substrate 94, respectively. However, the present invention is not necessarily limited to this structure. For example, substrates 186 and 194 shown in FIGS. 43A and 43B may be used in place of the substrates 86 and 94. In this regard, while structures of first surfaces of the substrates 186 and 194 are not shown in the figure, they are the same as those of the first surfaces 86A and 94A of the substrates 86 and 94, respectively.

One opening end of an aperture 186c is formed on the second surface 186B of the substrate 186 on each side. A shape of the one opening end of the aperture 186c is different from a shape of the other opening end of the aperture 186c. On the periphery of the one opening of the respective aperture 186c, a seating face 186CE is formed. One opening end of an aperture 186e is formed adjacent to the respective aperture 186c. A shape of the one opening end of the aperture 186e is different from a shape of the other opening end of the aperture 186e. Further, one opening end of an aperture 186d is formed adjacent to the aperture 186c. A shape of the one opening end of the aperture 186d is different from a shape of the other opening end of the aperture 186d. On the respective sides on which the apertures 186e are formed, pins 186L are provided adjacent to respective apertures 186k while being obliquely opposed to each other. Between the respective pins 186L and the apertures 186k and a through-hole group 186H, a pair of belt-like indents 186DA and 186DB are provided opposite to each other. The indents 186DA and 186DB are formed substantially in parallel with each other along the respective sides. An inner size of the indents 186DA and 186DB with a length A and a width AW is set a little larger than an outer size of protrusions 186PA and 186PB described later with a length B and a width BW, respectively.

As described later, when the above-described probe pins 92 are used, protrusions 194PB and 194PA in the substrate 194 are inserted into the indents 186DA and 186DB, respectively.

On each side on which are provided each apertures 186d, the protrusions 186PA and 186PB are formed opposite to each other adjacent to the indents 186DA and 186DB in a manner that the protrusions 186PA and 186PB and the indents 186DA and 186DB are on a common circumference. When the probe pins 22 are used, the respective protrusions 186PA and 186PB are brought into contact with the protrusions 194PB and 194PA in the substrate 194 described later, respectively.

One opening end of an aperture 194c is formed on the second surface 194B of the substrate 194. A shape of the one opening end of the aperture 194c is different from a shape of the other opening end of the aperture 194c. On the periphery of the one opening of the respective aperture 194c, a seating face 194CE is formed. One opening end of an aperture 194e is formed adjacent to the respective aperture 194c. A shape of the one opening end of the aperture 194e is different from a shape of the other opening end of the aperture 194e. Further, one opening end of an aperture 194d is formed adjacent to the aperture 194c. A shape of the one opening end of the aperture 194d is different from a shape of the other opening end of the aperture 194d. On the respective sides on which the apertures 194e are formed, pins 194LB are provided adjacent to respective apertures 194k while being obliquely opposed to each other. Between the respective pins 194LB and the apertures 194k and a through-hole group 194H, a pair of belt-like indents 194DA and 194DB are provided.

On each side on which are provided the apertures 194d, the belt-like protrusions 194PA and 194PB are formed opposite to each other adjacent to the indents 194DA and 194DB in a manner that the protrusions 194PA and 194PB and the indents 194DA and 194DB are on a common circumference. A length A and a width AW of the indents 194DA and 194DB are set larger than a length B and a width BW of the protrusions 194PA and 194PB. The length A and the width AW of the indents 194DA and 194DB are equal to a length and a width of the indents 186DA and 186DB of the substrate 186, respectively. In addition, the length B and the width BW of the protrusions 194PA and 194PB are equal to a length and a width of the protrusions 186PA and 186PB of the substrate 186, respectively. Accordingly, when the probe pins 22 are used, the protrusions 194PA and 194PB are brought into contact with the respective protrusions 186PB and 186PA of the substrate 186.

In such structure, when e.g. the probe pin cartridge having the probe pins 92 are prepared, such probe pin cartridge is prepared by initially mounting the probe pins 92 onto the substrate 194 and then the substrate 194 is laid onto the substrate 186 so that the protrusions 194PA and 194PB of the substrate 194 are inserted into the indents 186DA and 186DB of the substrate 186. That is, the substrate 186 is laid on the substrate 194 at a position rotating counterclockwise by 900 from a state shown in FIG. 43A.

In this manner, in this embodiment, a combination of the protrusions of the substrate 186 and the protrusions of the substrate 194 or a combination of the indents of the substrate 186 and the protrusions of the substrate 194 is changed, whereby the total thickness of the substrates 186 and 194 is made variable.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

The invention claimed is:

1. A semiconductor device socket comprising:
a contact terminal group having, at opposite ends, contact sections for electrically connecting terminals of a semiconductor device to electrode sections of a wiring board;
a first substrate having apertures configured to hold contact sections at a first end of the contact terminal group;
a second substrate having apertures configured to hold the contact sections of the contact terminal group at a second end; and
coupling means configured to couple said first and second substrates, wherein the contact sections of the contact terminal group project outward from surfaces of said first and second substrates; and wherein a position of said coupled first and second substrates relative to the semiconductor socket is reversible.

2. The semiconductor device socket as claimed in claim 1, wherein said first and second substrates are of the same structure.

3. The semiconductor device socket as claimed in claim 1, wherein said first and second substrates have apertures into which fixing means are inserted, the fixing means fixing said first and second substrates to the wiring board.

4. The semiconductor device socket as claimed in claim 1, wherein the contact sections of the contact terminals are projected outward by the same length from the surfaces of said first and second substrates.

5. The semiconductor device socket as claimed in claim 1, wherein said first and second substrates have apertures configured to receive positioning pins, and wherein the positioning pins are configured to engage indentations formed in said first and second substrates.

6. The semiconductor device socket as claimed in claim 1, wherein the contact terminal group is a probe pin group.

* * * * *